United States Patent
Shin

(10) Patent No.: US 12,022,675 B2
(45) Date of Patent: Jun. 25, 2024

(54) DISPLAY DEVICE CONNECTING CATHODE ELECTRODE AND AUXILIARY ELECTRODE OF LIGHT EMITTING ELEMENT BY USING ION MIGRATION OF ANODE ELECTRODE OF LIGHT EMITTING ELEMENT AND MANUFACTURING METHOD OF SAME

(71) Applicant: LG Display Co., Ltd., Seoul (KR)

(72) Inventor: Kwanghoon Shin, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 146 days.

(21) Appl. No.: 17/125,005

(22) Filed: Dec. 17, 2020

(65) Prior Publication Data

US 2021/0193954 A1  Jun. 24, 2021

(30) Foreign Application Priority Data

Dec. 20, 2019 (KR) .................. 10-2019-0171594

(51) Int. Cl.
*H10K 50/824* (2023.01)
*H10K 50/816* (2023.01)
(Continued)

(52) U.S. Cl.
CPC ......... *H10K 50/824* (2023.02); *H10K 50/816* (2023.02); *H10K 59/122* (2023.02);
(Continued)

(58) Field of Classification Search
CPC ............. H01L 27/3246; H01L 27/3258; H01L 27/3276; H01L 51/5215; H01L 51/56;
(Continued)

(56) References Cited

U.S. PATENT DOCUMENTS

2003/0017422 A1\*  1/2003  Yamaguchi ....... G02F 1/133553
   430/319
2007/0080356 A1\*  4/2007  Nakayama .......... H01L 51/5228
   257/E27.111
(Continued)

FOREIGN PATENT DOCUMENTS

CN  105655375 A  6/2016
CN  106486606 A  3/2017
(Continued)

OTHER PUBLICATIONS

Taiwanese Office Action dated Jul. 30, 2021 issued in corresponding Patent Application No. 109144453 w/English Translation (7 pages).
(Continued)

*Primary Examiner* — Eric W Jones
(74) *Attorney, Agent, or Firm* — POLSINELLI PC

(57) ABSTRACT

A display device includes a substrate including an emission area and a non-emission area; a circuit element layer formed on the substrate and having circuit elements disposed thereon; an overcoat layer covering the circuit element layer; an auxiliary electrode formed on the overcoat layer in the non-emission area and composed of multiple layers with a reflective layer in between; an electron transport layer covering the auxiliary electrode; and a cathode electrode formed on the electron transport layer, wherein the auxiliary electrode includes an electrode hole passing through the multiple layers, and the reflective layer includes at least one protrusion protruding toward inside from a sidewall of the electrode hole and contacting the cathode electrode.

13 Claims, 18 Drawing Sheets

(51) Int. Cl.
*H10K 59/122* (2023.01)
*H10K 59/124* (2023.01)
*H10K 59/131* (2023.01)
*H10K 71/00* (2023.01)

(52) U.S. Cl.
CPC ......... *H10K 59/124* (2023.02); *H10K 59/131* (2023.02); *H10K 71/00* (2023.02)

(58) Field of Classification Search
CPC .............. H01L 51/5228; H10K 50/824; H10K 50/816; H10K 59/131; H10K 59/122; H10K 59/124; H10K 71/00
USPC ..................................................... 257/40, 59
See application file for complete search history.

(56) References Cited

U.S. PATENT DOCUMENTS

| | | | | |
|---|---|---|---|---|
| 2012/0168755 A1* | 7/2012 | Choi | ................ | H01L 27/124 257/E29.139 |
| 2016/0035813 A1* | 2/2016 | Lee | ................ | H10K 50/814 438/23 |
| 2016/0141341 A1* | 5/2016 | Kajiyama | ................ | G09G 3/30 257/89 |
| 2016/0155790 A1* | 6/2016 | Lee | ................ | H01L 51/56 438/34 |
| 2017/0288174 A1 | 10/2017 | Ueda | | |
| 2018/0097047 A1* | 4/2018 | Jung | ................ | H01L 51/5228 |
| 2018/0151828 A1* | 5/2018 | Im | ................ | H01L 51/5228 |
| 2019/0198806 A1 | 6/2019 | Im et al. | | |

FOREIGN PATENT DOCUMENTS

| | | |
|---|---|---|
| CN | 107039494 A | 8/2017 |
| CN | 110021638 A | 7/2019 |
| KR | 10-2016-0114496 A | 10/2016 |
| KR | 10-2017-0078168 A | 7/2017 |
| KR | 10-2017-0139957 A | 12/2017 |
| KR | 10-2019-0066495 A | 6/2019 |
| KR | 10-2019-0079954 A | 7/2019 |
| TW | 201839974 A | 11/2018 |

OTHER PUBLICATIONS

Chinese Office Action dated Dec. 11, 2023 issued in Patent Application No. 202011397977.3 w/English Translation (19 pages).

* cited by examiner

DISPLAY DEVICE CONNECTING CATHODE ELECTRODE AND AUXILIARY ELECTRODE OF LIGHT EMITTING ELEMENT BY USING ION MIGRATION OF ANODE ELECTRODE OF LIGHT EMITTING ELEMENT AND MANUFACTURING METHOD OF SAME

CROSS-REFERENCE TO RELATED APPLICATION

The application claims the benefit of Korean Patent Application No. 10-2019-0171594 filed on Dec. 20, 2019, which is hereby incorporated by reference in its entirety.

BACKGROUND

Field of the Disclosure

The present disclosure relates to a display device and a manufacturing method of the same.

Description of the Background

As information society has developed, various types of display devices have been developed. Recently, various display devices such as a liquid crystal display (LCD), a plasma display panel (PDP), and an organic light emitting display (OLED) have been utilized.

The organic light emitting element constituting the organic light emitting display device is a self-emission type, and does not require a separate light source, so that the thickness and weight of the display device can be reduced. In addition, the organic light emitting diode display exhibits high quality characteristics such as low power consumption, high luminance, and high reaction speed.

SUMMARY

Accordingly, the present disclosure is to provide a display device and a manufacturing method of the same, the display device connecting a cathode electrode and an auxiliary electrode of a light emitting element by using ion migration of a reflective layer constituting an anode electrode of the light emitting element.

A display device according to an aspect of the present disclosure includes a substrate including an emission area and a non-emission area; a circuit element layer formed on the substrate and having circuit elements disposed thereon; an overcoat layer covering the circuit element layer; an auxiliary electrode formed on the overcoat layer in the non-emission area and composed of multiple layers with a reflective layer in between; an electron transport layer covering the auxiliary electrode; and a cathode electrode formed on the electron transport layer, wherein the auxiliary electrode includes an electrode hole passing through the multiple layers, and the reflective layer includes at least one protrusion protruding toward inside from a sidewall of the electrode hole and contacting the cathode electrode.

The at least one protrusion may be formed irregularly.

The at least one protrusion may have a shape in which at least one region is reverse-tapered.

The electron transport layer may be discontinuously formed on the at least one protrusion; and the cathode electrode may be continuously formed on the at least one protrusion.

The electron transport layer may be formed to cover one region of the at least one protrusion and expose other region.

The cathode electrode may cover the exposed other region of the at least one protrusion.

The auxiliary electrode may be made of silver or silver alloy.

The auxiliary electrode may include a first transparent conductive layer; the reflective layer disposed on the transparent conductive layer; and a second transparent conductive layer disposed on the reflective layer.

The circuit element layer may include an auxiliary wire formed on the substrate and connected to a power line; at least one insulating layer covering the auxiliary wire; and a bridge electrode formed on the at least one insulating layer and connected to the auxiliary wire through a contact hole, wherein the auxiliary wire is connected to the bridge electrode through a via hole passing through the overcoat layer.

The electrode hole may be formed in a region corresponding to the via hole.

The display device may further include an anode electrode formed on the overcoat layer in the emission area; a bank formed on the overcoat layer and covering an edge region of the anode electrode and the auxiliary electrode; and a light emitting layer formed in a center region of the anode electrode not covered by the bank, wherein the electron transport layer and the cathode electrode are widely formed on the emission area and the non-emission area.

The display device may further include at least one of a hole injection layer and a hole transport layer interposed between the anode electrode and the emission layer.

A manufacturing method of a display device according to an aspect includes forming a circuit element layer on a substrate including an emission area and a non-emission area; forming an overcoat layer covering the circuit element layer; stacking multiple layers including a reflective layer on the overcoat layer in the non-emission area to form an auxiliary electrode; forming an electrode hole passing through the multiple layers on the auxiliary electrode; treating the substrate to induce ion transition of the reflective layer; forming an electron transport layer covering the auxiliary electrode; and forming a cathode electrode on the electron transport layer.

The treating of the substrate may include leaving the substrate at room temperature or treating the substrate with heat, ozone, or hydrogen sulfide.

As the substrate is treated, at least one protrusion protruding toward inside from a sidewall of the electrode hole may be formed in the reflective layer.

The forming of the electron transport layer and the forming of the cathode electrode may be performed through evaporation deposition or physical vapor deposition.

The electron transport layer may be discontinuously formed on the at least one protrusion; and the cathode electrode may be continuously formed on the at least one protrusion.

The cathode electrode may cover an exposed region of the at least one protrusion not covered by the electron transport layer.

The forming of the circuit element layer may include forming an auxiliary wire on the substrate; forming at least one insulating layer covering the auxiliary wire; and forming a bridge electrode connected to the auxiliary wire through a contact hole on the at least one insulating layer.

The method may further include, after the forming of the overcoat layer covering the circuit element layer, forming a via hole in the overcoat layer, wherein the auxiliary electrode is connected to the bridge electrode through the via hole.

The display device and the manufacturing method of the same according to aspects can simplify a connection structure and a connection method between the cathode electrode and the auxiliary electrode of the light emitting element, thereby reducing the resistance between the cathode electrode and the auxiliary electrode.

The display device and the manufacturing method of the same according to aspects can reduce power consumption and heat generation and improve image quality.

The display device and the manufacturing method of the same according to aspects enable implementing display panels having long-life, high-efficiency, and uniform large-area.

BRIEF DESCRIPTION OF THE DRAWINGS

The accompanying drawings, which are included to provide a further understanding of the disclosure and are incorporated in and constitute a part of this specification, illustrate aspects of the disclosure and, together with the description, serve to explain the principles of the disclosure.

In the drawings.

DETAILED DESCRIPTION

Figure 1:
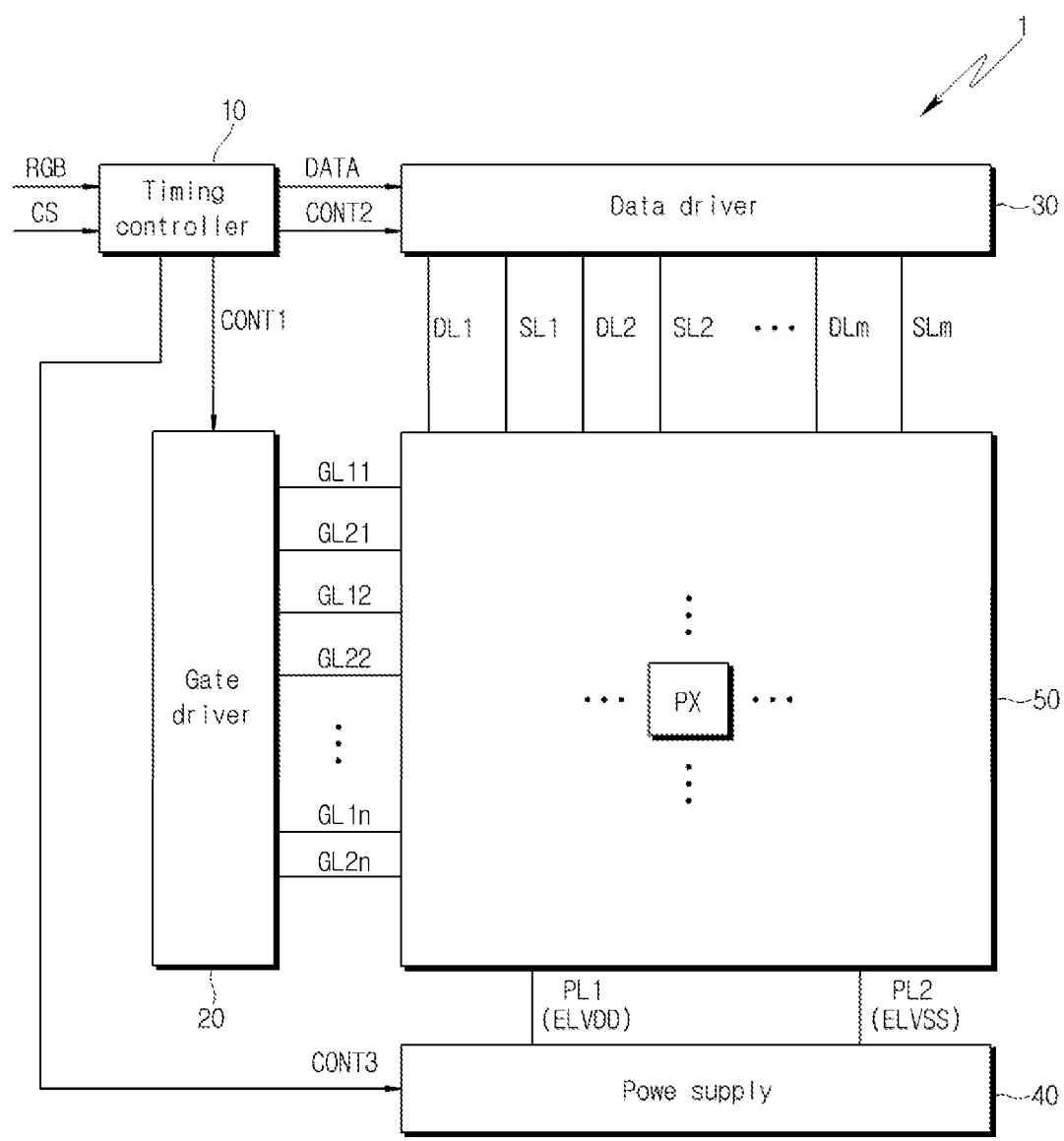
FIG. 1 is a block diagram illustrating a configuration of a display device according to an aspect of the present disclosure.

Hereinafter, aspects according to the present disclosure will be described with reference to the accompanying drawings. In this specification, when a component (or region, layer, part, etc.) is referred to as being "on", "connected" to, or "joined" to another component, it means that the component may be directly connected/coupled to another component or the component can be connected/coupled to another component with a third component in between.

The same reference numbers refer to the same components. In addition, in the drawings, the thickness, ratio, and dimensions of the components are exaggerated for effective description of technical content. Terms "and/or" include one or more combinations capable of being defined by associated configurations.

Terms such as "first" and "second" may be used to describe various components, but the components are not limited by the terms. The terms are used only for the purpose of distinguishing one component from other components. For example, the first component may be referred to as a second component without departing from the scope of rights of various aspects, and similarly, the second component may also be referred to as a first component. Singular expressions include plural expressions unless the context clearly indicates otherwise.

The terms such as "below", "lower", "above", "upper", etc. are used to describe the association of the components shown in the drawings. The terms are relative concepts and are explained on the basis of the directions indicated in the drawings.

It should be understood that terms such as "comprise" or "have" is intended to designate the presence of features, numbers, steps, operations, components, parts or combinations thereof described in the specification, but not to exclude the possibility of the presence or addition of one or more other features or numbers, steps, operations, components, parts, or combinations thereof.

FIG. 1 is a block diagram illustrating a configuration of a display device according to an aspect of the present disclosure.

Referring to FIG. 1, the display device 1 may include a timing controller 10, a gate driver 20, a data driver 30, a power supply 40, and a display panel 50.

The timing controller 10 may receive an image signal RGB and a control signal CS from the outside. The image signal RGB may include a plurality of pieces of gradation data. The control signal CS may include, for example, a horizontal synchronization signal, a vertical synchronization signal, and a main clock signal.

The timing controller 10 processes the image signal RGB and the control signal CS in such a manner as to be suitable for operating conditions of the display panel 50, to generate and output an image data DATA, a gate driving control signal CONT1, a data driving control signal CONT2, and a power supply control signal CONT3.

The gate driver 20 may be connected to pixels PXs of the display panel 50 through a plurality of first gate lines GL11 to GL1n. The gate driver 20 may generate gate signals on the basis of the gate driving control signal CONT1 output from the timing controller 10. The gate driver 20 may provide the generated gate signals to the pixels PX through the plurality of first gate lines GL11 to GL1n.

According to various aspects, the gate driver 20 may be further connected to the pixels PXs of the display panel 50 through a plurality of second gate lines GL21 to GL2n. The gate driver 20 may provide a sensing signal to the pixels PXs through the plurality of second gate lines GL21 to GL2n. The sensing signal may be supplied to measure the characteristics of a driving transistor and/or a light emitting element provided inside the pixels PXs.

The data driver 30 may be connected to the pixels PXs of the display panel 50 through a plurality of data lines DL1 to DL$m$. The data driver 30 may generate data signals on the basis of the image data DATA and the data driving control signal CONT2 output from the timing controller 10. The data driver 30 may provide the generated data signals to the pixels PXs through the plurality of data lines DL1 to DL$m$.

According to various aspects, the data driver 30 may be further connected to the pixels PXs of the display panel 50 through a plurality of sensing lines (or reference lines) SL1 to SL$m$. The data driver 30 provides a reference voltage (or a sensing voltage, an initialization voltage) to the pixels PXs through the plurality of sensing lines SL1 to SL$m$, or senses states of the pixels PX on the basis of electrical signals fed back from the pixels PXs.

The power supply 40 may be connected to the pixels PXs of the display panel 50 through a plurality of power lines PL1 and PL2. The power supply 40 may generate a driving voltage to be provided to the display panel 50 on the basis of the power supply control signal CONT3. The driving voltage may include, for example, a high potential driving voltage ELVDD and a low potential driving voltage ELVSS. The power supply 40 may provide the generated driving voltages ELVDD and ELVSS to the pixels PXs through corresponding power lines PL1 and PL2.

A plurality of pixels PXs (or referred to as sub-pixels) is disposed on the display panel 50. The pixels PX may be arranged in the form of a matrix on the display panel 50, for example.

Each pixel PX may be electrically connected to a corresponding gate line and data line. The pixels PX may emit light with luminance corresponding to the gate signals and the data signals supplied through the gate lines GL1 to GLn and the data lines DL1 to DLm.

Each pixel PX may display any one of the first to third colors. In one aspect, each pixel PX may display any one of red, green, and blue colors. In another aspect, each pixel PX may display any one of cyan, magenta, and yellow colors. In various aspects, the pixels PXs may be configured to display any one of four or more colors. For example, each pixel PX may display any one of red, green, blue, and white colors.

The timing controller 10, the gate driver 20, the data driver 30, and the power supply 40 may be each configured with a separate integrated circuit (IC), or at least a part of the timing controller 10, the gate driver 20, the data driver 30, and the power supply 40 may be formed in an integrated circuit. For example, at least one of the data driver 30 and the power supply 40 may be composed of an integrated circuit combined with the timing controller 10.

In addition, in FIG. 1, the gate driver 20 and the data driver 30 are shown as separate components from the display panel 50, but at least one of the gate driver 20 and the data driver 30 may be integrally formed with the display panel 50 by in-panel method. For example, the gate driver 20 may be integrally formed with the display panel 50 according to a Gate in Panel (GIP) method.

Figure 2:
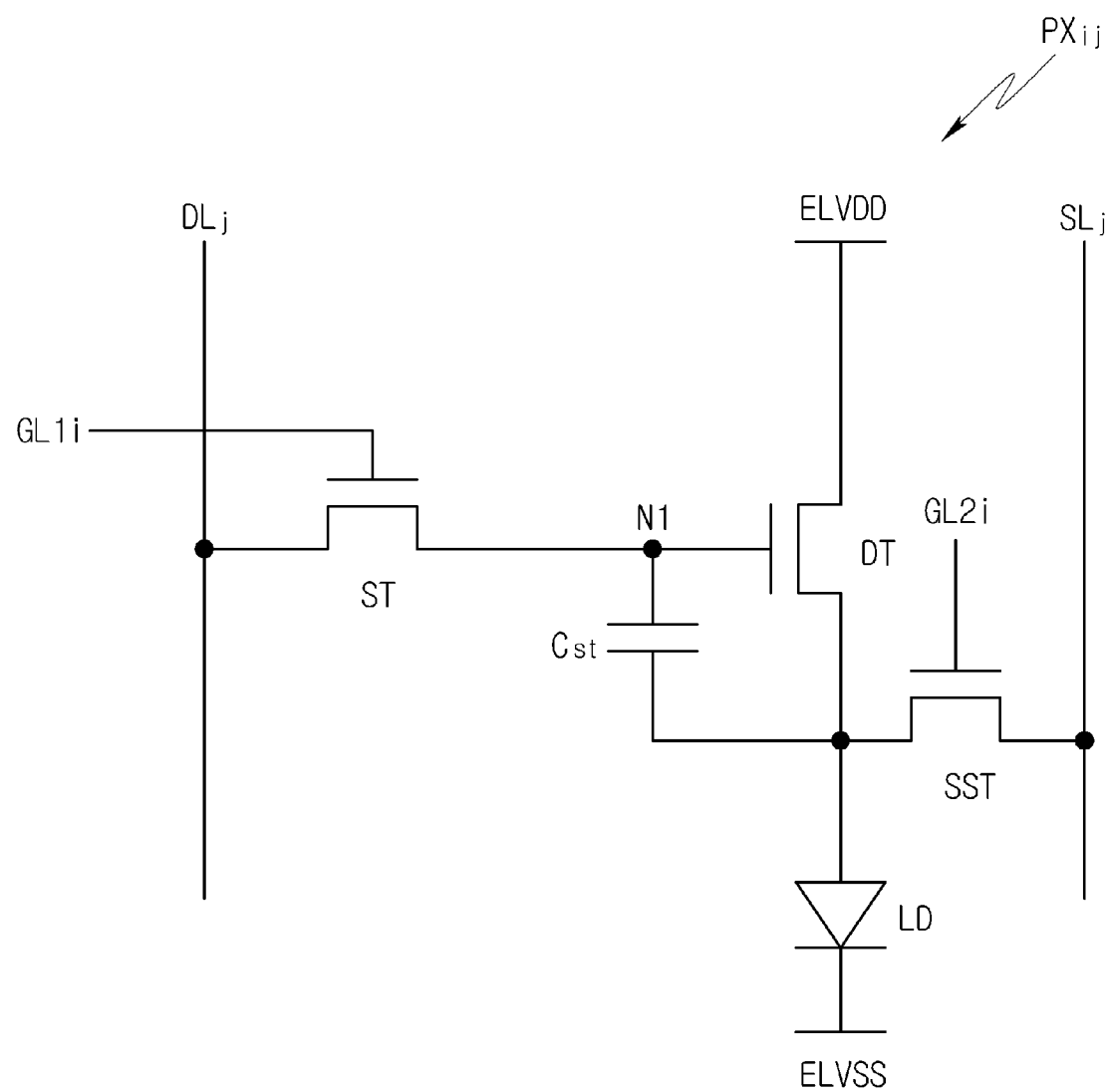
FIG. 2 is a circuit diagram illustrating a pixel illustrated in FIG. 1 according to an aspect of the present disclosure.

FIG. 2 is a circuit diagram illustrating an aspect of the pixel illustrated in FIG. 1. FIG. 2 illustrates an example of a pixel PXij connected to the i-th gate line GLi and the j-th data line DLj.

Referring to FIG. 2, the pixel PX includes a switching transistor ST, a driving transistor DT, a sensing transistor SST, a storage capacitor Cst, and a light emitting element LD.

In the switching transistor ST, a first electrode (e.g., source electrode) is electrically connected to the j-th data line DLj, and a second electrode (e.g., drain electrode) is electrically connected to a first node N1. A gate electrode of the switching transistor ST is electrically connected to the i-th gate line GLi. When a gate signal of a gate-on level is applied to the i-th gate line GLi, the switching transistor ST is turned on, to transmit a data signal V_data applied to the j-th data line DLj to the first node N1.

The storage capacitor Cst is configured to have a first electrode electrically connected to the first node N1, and a second electrode connected to a first electrode of the light emitting element LD. The storage capacitor Cst may charge a voltage corresponding to a difference between a voltage applied to the first node N1 and a voltage applied to the first electrode of the light emitting element LD.

The driving transistor DT is configured to have a first electrode (e.g., source electrode) receiving a high potential driving voltage ELVDD, and a second electrode (e.g., drain electrode) electrically connected to a first electrode (e.g., anode electrode) of the light emitting element LD. The gate electrode of the driving transistor DT is electrically connected to the first node N1. When a voltage of the gate-on level is applied through the first node N1, the driving transistor DT is turned on to control an amount of driving current I_DS flowing through the light emitting element LD in correspondence with the voltage provided to the gate electrode.

In the sensing transistor SST, a first electrode (e.g., source electrode) is electrically connected to the j-th sensing line SLj, and a second electrode (e.g., drain electrode) is electrically connected to a first electrode of the light emitting element LD. A gate electrode of the sensing transistor SST is electrically connected to the i-th second gate line GL2i. When a sensing signal of a gate-on level is applied to the i-th second gate line GL2i, the sensing transistor SST is turned on so that the reference voltage applied to the j-th sensing line SLj is transmitted to a first electrode of the light emitting element LD.

The light emitting element LD outputs light corresponding to the driving current. The light emitting element LD may output light corresponding to any one of red, green, and blue colors. The light emitting element LD may be an organic light emitting diode OLED, or an ultra-small inorganic light emitting diode having a size ranging from micro to nanoscale, but the present disclosure is not limited thereto. Hereinafter, the technical idea of the present disclosure will be described with reference to an aspect in which the light emitting element LD is composed of an organic light emitting diode.

In the present disclosure, the structure of the pixel PX is not limited to that shown in FIG. 2. According to an aspect, the pixel PX may further include at least one element for compensating a threshold voltage of the driving transistor DT or for initializing a voltage of a gate electrode of the driving transistor DT and/or a voltage of an anode electrode of the light emitting element LD.

Although an example in which the switching transistor ST, the driving transistor DT, and the sensing transistor SST are NMOS transistors is shown in FIG. 2, the present disclosure is not limited thereto. For example, at least a part or all of transistors constituting each pixel PX may be configured as PMOS transistors. In various aspects, each of the switching transistor ST, the driving transistor DT, and the sensing transistor SST may be implemented as a low temperature polysilicon (LTPS) thin film transistor, an oxide thin film transistor, or a low temperature polycrystalline oxide (LTPO) thin film transistor.

Figure 3:
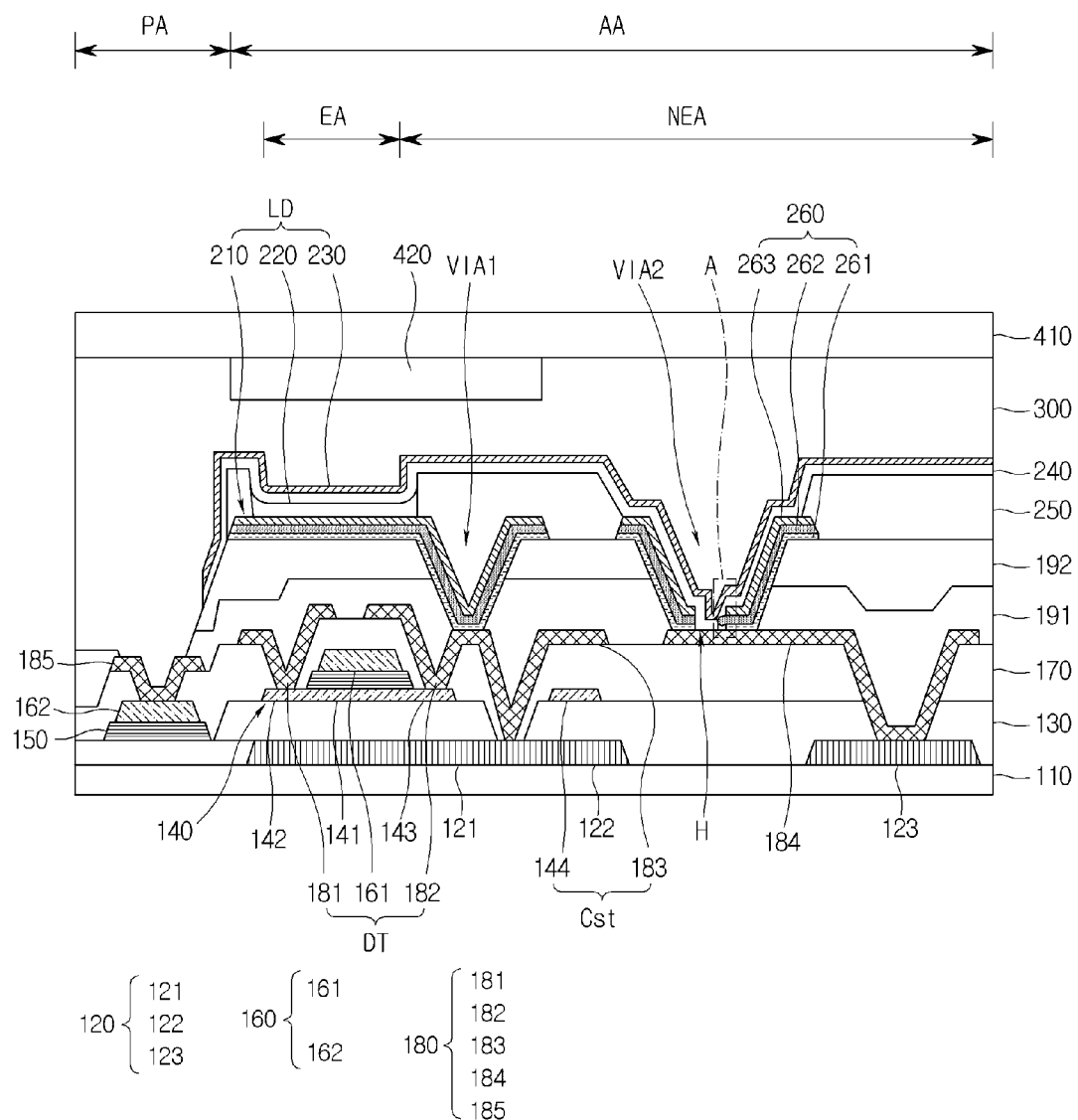
FIG. 3 is a cross-sectional view illustrating a display panel according to an aspect of the present disclosure.
Figure 4:
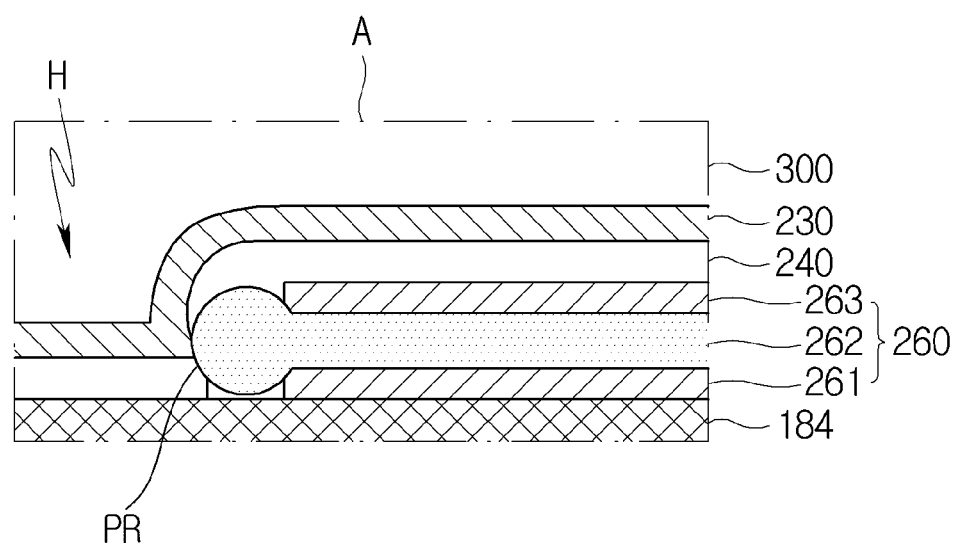
FIG. 4 is an enlarged cross-sectional view of area AA of FIG. 3.

FIG. 3 is a cross-sectional view illustrating a display panel according to an aspect. FIG. 4 is an enlarged cross-sectional view illustrating an area AA of FIG. 3.

Referring to FIG. 3, a pixel PX according to an aspect includes a substrate 100, a circuit element layer formed on the substrate 100 and provided with at least one circuit element, and a light emitting element layer provided with a light emitting element LD.

The substrate 100 may be a light-transmitting substrate, as a base substrate of the display panel 50. The substrate 100 may be a rigid substrate including glass or tempered glass or a flexible substrate made of plastic. For example, the substrate 100 may be formed of a plastic material such as polyimide, polyethylene terephthalate (PET), polyethylene naphthalate (PEN), polycarbonate (PC), and the like. However, the material of the substrate 100 is not limited thereto. The substrate 100 may include a pad area PA and a display area AA.

The circuit element layer is formed on the substrate 100 and may include circuit elements (e.g., transistors and capacitors) and wires constituting the pixel PX.

A first conductive layer 120 may be disposed on the substrate 100. The first conductive layer 120 may include a light blocking layer 121, a lower electrode 122 of the storage capacitor Cst, and an auxiliary wire 123. The auxiliary wire 123 may be connected to a second power line PL2 to which the low potential driving voltage ELVSS is applied. The light blocking layer 121 is disposed to overlap an active layer 140, particularly, a channel 141 on a plane, thereby protecting the oxide semiconductor device from external light. The lower electrode 122 of the storage capacitor Cst may be integrally formed with the light blocking layer 121 as a single pattern. However, this aspect is not limited thereto.

A buffer layer 130 is disposed on the substrate 100 to cover the light blocking layer 121 and the auxiliary wire 123. The buffer layer 130 may prevent ions or impurities from diffusing from the substrate 100 and block moisture penetration. In addition, the buffer layer 130 may improve the surface flatness of the substrate 100. The buffer layer 130 may include inorganic, organic, or organic/inorganic composites such as oxides and nitrides, and may be formed in a single layer or multi-layer structure. For example, the buffer layer 130 may have a structure of three or more layers consisting of silicon oxide, silicon nitride, and silicon oxide.

An active layer 140 may be formed on the buffer layer 130. The active layer 140 may be formed of a silicon-based semiconductor material or an oxide-based semiconductor material. Examples of the silicon-based semiconductor material may include amorphous silicon or polycrystalline silicon. Examples of the oxide-based semiconductor material include a quaternary metal oxide such as indium tin gallium zinc oxide (InSnGaZnO), ternary metal oxides such as indium gallium zinc oxide (InGaZnO), indium tin zinc oxide (InSnZnO), indium aluminum zinc oxide (InAlZnO), tin gallium zinc oxide (SnGaZnO), aluminum gallium zinc oxide (AlGaZnO), and tin aluminum zinc oxide (SnAlZnO), binary metal oxide such as indium zinc oxide (InZnO), tin zinc oxide (SnZnO), aluminum zinc oxide (AlZnO), zinc magnesium oxide (ZnMgO), tin magnesium oxide (SnMgO), indium magnesium oxide (InMgO), indium gallium oxide (InGaO), and signal metal oxide such as indium oxide (InO), tin oxide (SnO), and zinc oxide (ZnO), and the like.

The active layer 140 may include a source region 142 and a drain region 143 containing p-type or n-type impurities, and a channel 141 formed between the source region 142 and the drain region 143. One region of the active layer 140 may form an intermediate electrode 144 of the storage capacitor Cst. The intermediate electrode 144 may be disposed such that at least one region thereof overlaps the lower electrode 122. An electric field is formed between the lower electrode 122 formed on the first conductive layer 120 and the intermediate electrode 144 formed on the active layer 140 to allow the storage capacitor Cst to function.

A gate insulating layer 150 may be disposed corresponding to a region where a gate electrode 161 and a pad 162 to be described later are formed. For example, the gate insulating layer 150 may be formed on a channel 141 of the active layer 140. The gate insulating layer 150 may be silicon oxide (SiOx), silicon nitride (SiNx), or multiple layers thereof.

A second conductive layer 160 may be disposed on the gate insulating layer 150. The second conductive layer 160 may include a gate electrode 161. The gate electrode 161 may be disposed at a position corresponding to the channel 141 of the active layer 140. The gate electrode 161 is formed with any one selected from a group consisting of molybdenum (Mo), aluminum (Al), chromium (Cr), gold (Au), titanium (Ti), nickel (Ni), neodymium (Nd), and copper (Cu), or alloys thereof. In addition, the gate electrode 161 may be multilayer composed of any one selected from a group consisting of molybdenum (Mo), aluminum (Al), chromium (Cr), gold (Au), titanium (Ti), nickel (Ni), neo- dymium (Nd), and copper (Cu), or alloys thereof. For example, the gate electrode 161 may be a double layer of molybdenum/aluminum-neodymium or molybdenum/aluminum.

The second conductive layer 160 may further include a pad 162. The pad 162 may be disposed in a pad area PA. The pad 162 may be electrically connected to the timing controller 10 and/or the power supply 40 through wires provided in the pad area PA. The pad 162 is made of the same material as the gate electrode 161 and may be formed through the same process, but the present disclosure is not limited thereto.

An interlayer insulating layer 170 may be formed on the second conductive layer 160. The interlayer insulating layer 170 covers the gate electrode 161 and the pad 162 constituting the second conductive layer 160. The interlayer insulating layer 170 may be a silicon oxide film (SiOx), a silicon nitride film (SiNx), or multiple layers composed thereof.

A third conductive layer 180 may be formed on the interlayer insulating layer 170. The third conductive layer 180 may include a source electrode 181 and a drain electrode 182. The source electrode 181 and the drain electrode 182 are disposed on the interlayer insulating layer 170 at a predetermined distance. The source electrode 181 and the drain electrode 182 may be connected to the source region 142 and the drain region 143 of the active layer 140 through contact holes passing through the interlayer insulating layer 170, respectively.

The source electrode 181 and the drain electrode 182 may be formed of a single layer or multiple layers composed of any one of Molybdenum (Mo), aluminum (Al), chromium (Cr), gold (Au), titanium (Ti), nickel (Ni), neodymium (Nd) and copper (Cu), or alloys thereof. In the case of multiple layers, the source electrode 181 and the drain electrode 182 may be composed of a double layer of molybdenum/aluminum-neodymium, or a triple layer of titanium/aluminum/titanium, molybdenum/aluminum/molybdenum, or molybdenum/aluminum-neodymium/molybdenum.

The source electrode 181, the drain electrode 182, the gate electrode 161, and the active layer 140 corresponding thereto may constitute a transistor. The transistor may be, for example, a driving transistor DT or a switching transistor ST. In FIG. 4, a driving transistor DT in which the drain electrode 182 is connected to an anode electrode 210 of the light emitting element LD is illustrated as an example.

The third conductive layer 180 may further include an upper electrode 183 of the storage capacitor Cst. According to an aspect, the upper electrode 183 may be integrally formed with a drain electrode 182 of the driving transistor DT, but is not limited thereto. The upper electrode 183 may be disposed so that at least region thereof overlaps the intermediate electrode 144. An electric field is formed between the intermediate electrode 144 formed on the active layer 140 and the upper electrode 183 formed on the third conductive layer 180 to allow the storage capacitor Cst to function.

As described above, according to the present aspect, the storage capacitor Cst has a double layer structure composed of the lower electrode 122, the intermediate electrode 144, and the upper electrode 183, but the present aspect is not limited thereto. The storage capacitor Cst may be formed of a single layer in which any one of the lower electrode 122, the intermediate electrode 144, and the upper electrode 183 is omitted.

The third conductive layer 180 may further include a bridge electrode 184. The bridge electrode 184 is connected to the auxiliary wire 123 through a contact hole passing through the interlayer insulating layer 170 and the buffer layer 130. The bridge electrode 184 may be made of the same material as the source electrode 181 and the drain electrode 182, and may be formed of a single layer or multiple layers.

In various aspects, the third conductive layer 180 may further include a pad connection electrode 185. The pad connection electrode 185 may be connected to the pad 162 through a contact hole passing through the interlayer insulating layer 170.

The circuit element layer may be covered by a passivation layer 191 and an overcoat layer 192.

Specifically, the passivation layer 191 may be formed on the third conductive layer 180. The passivation layer 191 may be as an insulating layer intended to protect the underlying elements, and may be a silicon oxide film (SiOx), a silicon nitride film (SiNx), or multiple layers composed thereof.

The overcoat layer 192 may be formed on the passivation layer 191. The overcoat layer 192 is formed in such a manner as to cover the display area AA. The overcoat layer 192 may be a planarization film intended to alleviate a step difference of the lower structure, and may be made of organic materials such as polyimide, benzocyclobutene series resin, and acrylate Here, the pad connection electrode 185 formed in the pad area PA is not covered by the passivation layer 191 and the overcoat layer 192, but exposed to the outside. The pad connection electrode 185 may be connected to a conductive lead line of an integrated circuit coupled to the pad area PA to send and receive electrical signals.

The light emitting element layer is formed on the overcoat layer 192 and includes light emitting elements LDs. The light emitting element LD includes an anode electrode 210, a light emitting layer 220, and a cathode electrode 230.

At least one of the anode electrode 210 and the cathode electrode 230 may be a transmissive electrode and the other may be a reflective electrode. For example, when the light emitting element LD is a back emission type, the anode electrode 210 may be a transmissive electrode, and the cathode electrode 230 may be a reflective electrode. Conversely, when the light emitting element LD is a front emission type, the anode electrode 210 may be a reflective electrode, and the cathode electrode 230 may be a transmissive electrode. According to another example, when the light emitting element LD is a double-sided emission type, both the anode electrode 210 and the cathode electrode 230 may be transmissive electrodes. Hereinafter, a detailed configuration of the light emitting element LD will be described with respect to a case where the light emitting element LD is a front emission type.

The anode electrode 210 is formed on the overcoat layer 192. The anode electrode 210 is connected to the drain electrode 182 of the driving transistor DT through a first via hole VIA1 passing through the overcoat layer 192 and the passivation layer 191. The anode electrode 210 may be composed of a transparent conductive material such as indium tin oxide (ITO), indium zinc oxide (IZO), or zinc oxide (ZnO). When the anode electrode 210 is a reflective electrode, the anode electrode 210 may include a reflective layer. The reflective layer may be made of a metal material such as aluminum (Al), copper (Cu), silver (Ag), nickel (Ni), or alloys thereof. According to an aspect, the reflective layer may be composed of APC (silver/palladium/copper alloy).

When the anode electrode 210 includes a reflective layer, the anode electrode 210 may be formed of a triple layer composed of a transparent conductive layer/reflective layer/transparent conductive layer. For example, the anode electrode 210 may be composed of a triple layer including ITO/Ag/ITO.

A bank 250 may be formed on the overcoat layer 192. The bank 250 may be a pixel defining layer defining an emission area EA of the pixel PX. The bank 250 may be formed to expose a portion, for example, a central region of the anode electrode 210 and cover the remaining region, for example, an edge. It may be desirable to design an area of the exposed anode electrode 210 to the maximum value possible to ensure a sufficient aperture ratio. The exposure area of the anode electrode 210 not covered by the bank 250 may be defined as the emission area EA of the pixel PX. In the emission area EA, the anode electrode 210, the emission layer 220, and the cathode electrode 230 are stacked to be in direct contact with each other. The bank 250 may be formed of an organic film such as an acrylic resin, an epoxy resin, a phenolic resin, a polyamide resin, or a polyimide resin.

An emission layer 220 is formed on the exposure area of the anode electrode 210 surrounded by the bank 250. The organic emission layer may be formed of an organic material including phosphorescent or fluorescent materials.

The color of light generated in the light emitting layer 220 may be one of red, green, and blue, but the present disclosure is not limited thereto. For example, the color of light generated from the light emitting layer 220 may be one of magenta, cyan, and yellow, or may be white.

According to an aspect, a hole transport layer (HTL), a hole injection layer (HIL), or the like may be disposed between the emission layer 220 and the anode electrode 210. The hole transport layer and the hole injection layer serve to smoothly transport holes injected from the anode electrode 210 to the light emitting layer 220.

The cathode electrode 230 is formed on the light emitting layer 220. The cathode electrode 230 may cover the emission layer 220 and may be formed widely on the display area AA. The cathode electrode 230 may be formed of a transparent conductive material (TCO) capable of transmitting light, or semi-transmissive conductive material such as Molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and alloys thereof. When the cathode electrode 230 is formed of a semi-transmissive metal material, light emission efficiency may be increased by a micro cavity.

An electron transport layer (ETL) 240 may be disposed between the cathode electrode 230 and the emission layer 220. The electron transport layer 240 serves to smoothly transfer electrons injected from the cathode electrode 230 to the light emitting layer 220.

According to this aspect, the pixel PX further includes an auxiliary electrode 260 for electrically connecting the cathode electrode 230 and the second power line PL2. The auxiliary electrode 260 is formed on the same layer as the anode electrode 210 and may be disposed in a non-emission area NEA. The auxiliary electrode 260 may be connected to the bridge electrode 184 through a second via hole VIA2 passing through the overcoat layer 192 and the passivation layer 191. Since the bridge electrode 184 is connected to the second power line PL2 via the auxiliary wire 123, the auxiliary electrode 260 may be electrically connected to the second power line PL2.

The auxiliary electrode 260 is composed of the same material as the anode electrode 210 and may be formed through the same process. According to an aspect, the auxiliary electrode 260 may be formed of a triple layer composed of ITO/Ag/ITO in the same manner as the anode electrode 210.

In the non-emission area NEA, the bank 250 may be formed in such a manner as to expose a center region and cover an edge in the auxiliary electrode 260. The cathode electrode 230 is formed widely in the display area AA and thus covers the center area of the exposed auxiliary electrode 260. The cathode electrode 230 may be electrically connected to the second power line PL2 through the auxiliary electrode 260, the bridge electrode 184, and the auxiliary wire 123.

When the electron transport layer 240 is formed on the lower layer of the cathode electrode 230, the cathode electrode 230 and the auxiliary electrode 260 may not be in direct contact with each other. In this aspect, the electrical connection between the cathode electrode 230 and the auxiliary electrode 260 may be completely or partially disconnected. Accordingly, the conduction between the cathode electrode 230 and the second power line PL2 is prevented, so that the low potential driving voltage ELVSS is not supplied to the cathode electrode 230.

According to the present aspect, in order to solve the above-described problem, a structure in which the cathode electrode 230 and the auxiliary electrode 260 may be stably contacted is provided despite the presence of the electron transport layer 240, by using migration of the metal material.

Specifically, referring to FIG. 4, according to the present aspect, the auxiliary electrode 260 is composed of a triple layer of transparent conductive layer 261 (first transparent conductive layer)/reflective layer 262/transparent conductive layer 263 (second transparent conductive layer). According to an aspect, the reflective layer 262 may be composed of silver (Ag) or silver alloy having high ion conductivity.

The electrode hole H passes through the triple layer of the auxiliary electrode 260 to expose the bridge electrode 184. The electrode hole H may be formed in a region (e.g., a region overlapping the second via hole VIA2) corresponding to the second via hole VIA2, but is not limited thereto. A transparent conductive layer 261, a reflective layer 262, and a transparent conductive layer 263 constituting the auxiliary electrode 260 may be exposed in the sidewall of the electrode hole H.

The reflective layer 262 may include at least one protrusion PR protruding toward the inside from the sidewall of the electrode hole H. According to an aspect, when the transparent conductive layer 261, the reflective layer 262, and the transparent conductive layer 263 are stacked on the overcoat layer 192 and then etched, so that the anode electrode 210, the auxiliary electrode 260, and the electrode hole H of the auxiliary electrode 260 are patterned, ion transition is generated in the reflective layer 262 exposed to the etchant, whereby the protrusion PR may be formed. According to another aspect, when the electrode hole H is formed, and then the substrate 110 on which the auxiliary electrode 260 is formed is left at room temperature, or heat treatment or ozone ($O_3$) or hydrogen sulfide ($H_2S$) processing is performed on the substrate 100, ion transition is induced in the reflective layer 262, whereby the projection PR may be formed. Such a projection PR is produced atypically. The end of the protrusion PR may have a curved surface or an angular shape, and at least one region thereof may be formed in a reverse-tapered shape.

After the bank 250 and the light emitting layer 220 are formed on the anode electrode 210 and the auxiliary electrode 260, the electron transport layer 240 may be formed by an evaporation deposition method such as thermal evaporation or a physical vapor deposition method such as sputtering. Herein, organic materials constituting the electron transport layer 240 may be cut off around the projection PR according to a step coverage characteristic and may be discontinuously deposited. As the electron transport layer 240 is cut off, the side surface and/or the lower surface of the protrusion PR may be not covered by the electron transport layer 240, but exposed to the outside.

The cathode electrode 230 may be formed by evaporation deposition method such as thermal evaporation or physical vapor deposition method such as sputtering. Since the cathode electrode 230 has a better step coverage characteristic than the electron transport layer 240, the cathode electrode 230 is continuously formed without being cut around the protrusion PR. The cathode electrode 230 may be formed to cover the side surface and/or the bottom surface of the protrusion PR, which is not covered by the electron transport layer 240 but exposed.

As such, as the cathode electrode 230 directly contacts the reflective layer 262, the electrical connection between the cathode electrode 230 and the auxiliary electrode 260 may be stably formed. The cathode electrode 230 may be stably connected to the second power line PL2 via the auxiliary electrode 260.

Referring back to FIG. 3, an encapsulation layer 300 may be formed on the cathode electrode 230. The encapsulation layer 300 serves to prevent external moisture from penetrating into the light emitting layer 220. The encapsulation layer 300 may be made of an inorganic insulating material, or may be formed of a structure in which inorganic insulating materials and organic insulating materials are alternately stacked, but is not limited thereto.

A cover substrate 410 may be formed on the encapsulation layer 300. The cover substrate 410 may be made of the same material as that of the substrate 110. The cover substrate 410 may be adhered to the encapsulation layer 300 through an adhesive or the like. However, the bonding method of the cover substrate 410 is not limited thereto.

In various aspects, a color filter 420 may be further formed between the encapsulation layer 300 and the cover substrate 410. The color filter 420 may be disposed in the emission area EA. The color filter 420 is a wavelength-selective optical filter selectively transmitting only a partial wavelength band of incident light, in such a manner as to transmit light in a specific wavelength band and block light in another specific wavelength band. The color filter may be composed of a photosensitive resin containing a colorant such as a pigment or dye. Light generated by the light emitting element LD and passing through the color filter 420 may have any one of red, green, and blue colors. When the pixel PX displays a white color, the color filter 420 may be omitted for the pixel PX.

FIGS. 5 to 20 are diagrams illustrating a manufacturing method of a display device according to an aspect.

Figure 5:
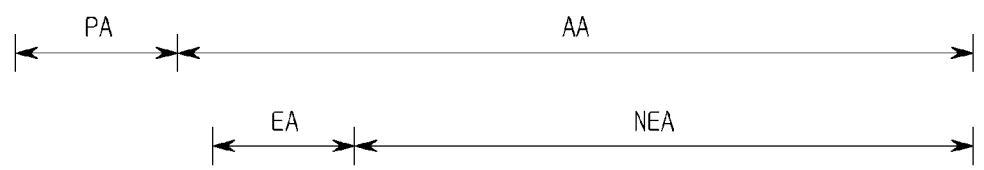
FIGS. 5 to 20 are diagrams illustrating a manufacturing method of a display device according to an aspect of the present disclosure.
Figure 5:
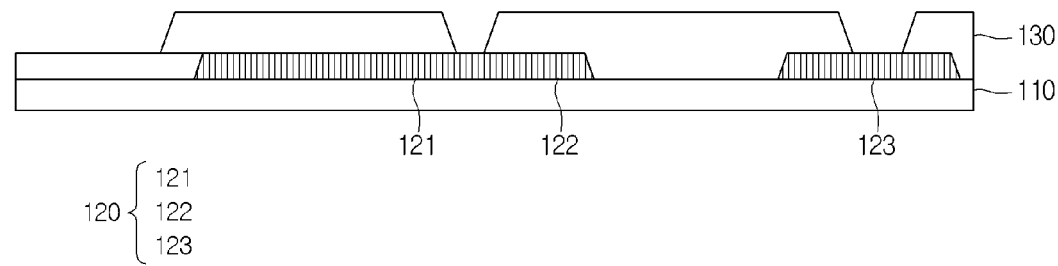

First, referring to FIG. 5, a first conductive layer 120 including a light blocking layer 121, a lower electrode 122 of a storage capacitor Cst, and an auxiliary wire 123 is formed on a substrate 110. The light blocking layer 121 and the lower electrode 122 of the storage capacitor Cst may be formed in a single pattern. A buffer layer 130 is formed on the first conductive layer 120.

Figure 6:
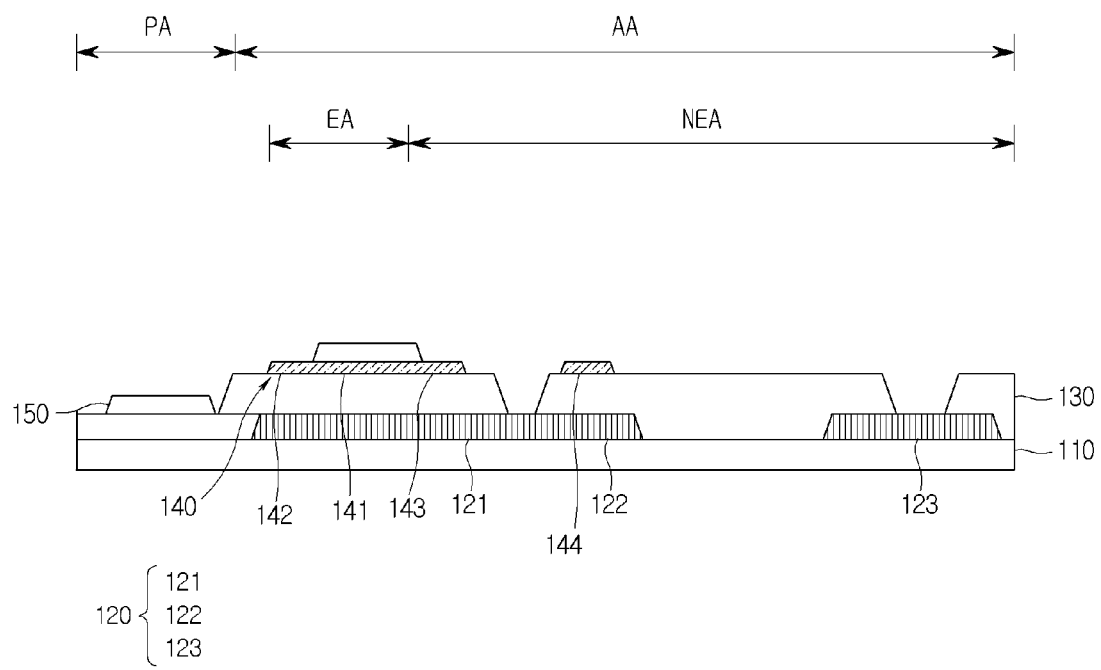

Referring to FIG. 6, an active layer 140 is formed on the buffer layer 130. A p-type or n-type impurities are doped into the active layer 140 so that a source region 142 and a drain region 143 are formed, and a channel 141 is formed between the source region 142 and the drain region 143. According to an aspect, an intermediate electrode 144 of the storage capacitor Cst may be further formed on the active layer 140.

A gate insulating layer 150 is formed on the active layer 140. The gate insulating layer 150 may be formed at a position where a gate electrode 161 and a pad 162 are to be disposed.

Figure 7:
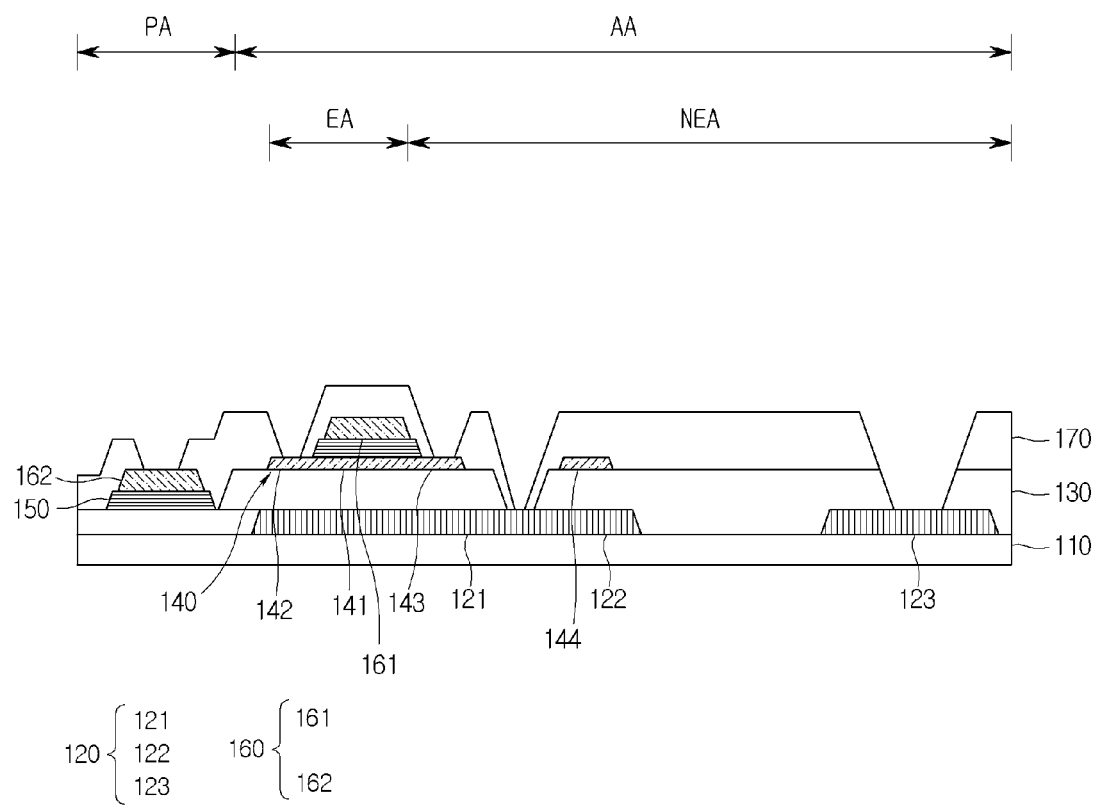

Referring to FIG. 7, the second conductive layer 160 is formed on the gate insulating layer 150. Specifically, the gate electrode 161 is formed on the gate insulating layer 150 in a display area AA, and the pad 162 may be formed on the gate insulating layer 150 in the pad area PA. An interlayer insulating layer 170 is formed on the second conductive layer 160. The interlayer insulating layer 170 may cover the second conductive layer 160, exposed regions of the active layer 140 where the gate insulating layer 150 and the second conductive layer 160 are not formed, and exposed regions of the buffer layer 120 where the active layer 140 is not formed.

After the interlayer insulating layer 170 is formed, contact holes that allow the first conductive layer 120, the active layer 140, and the second conductive layer 160 to contact the upper layer may be formed. For example, in order to allow the pad 162 to contact a pad connection electrode 185 to be formed later, a contact hole exposing a region of the pad 162 may be formed. In addition, in order to allow a source region 142 and a drain region 143 of the active layer 140 to contact a source electrode 181 and a drain electrode 182 to be formed later, a contact hole exposing the source region 142 and the drain region 143 may be formed. In addition, in order to allow the light blocking layer 121 and the auxiliary wire 123 to contact the drain electrode 182 and a bridge electrode 184 to be formed later, a contact hole exposing one region of each of the light blocking layer 121 and the auxiliary wire 123 may be formed.

Figure 8:
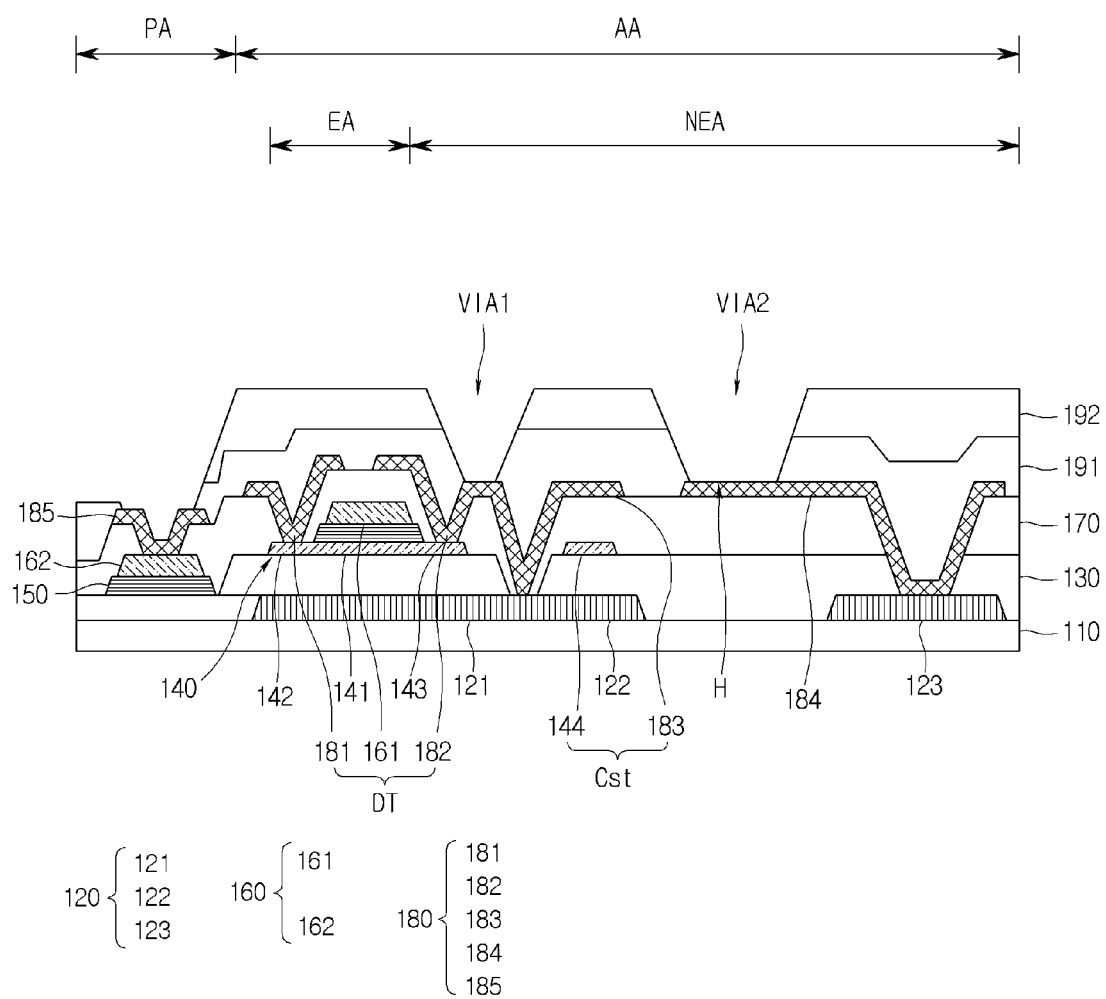

Referring to FIG. 8, a third conductive layer 180 is formed on the interlayer insulating layer 170. Specifically, the source electrode 181 and the drain electrode 182 are formed on the interlayer insulating layer 170 in the display area AA. The source electrode 181 and the drain electrode 182 are connected to the source region 142 and the drain region 143 of the active layer 140 through the contact holes, respectively. An upper electrode 183 of the storage capacitor Cst may be further formed on the third conductive layer 180. The upper electrode 183 may be formed as one pattern with the drain electrode 182. In addition, the bridge electrode 184 is further formed on the interlayer insulating layer 170 in the display area AA. The bridge electrode 184 is connected to the auxiliary wire 123 through the contact hole.

A pad connection electrode 185 is formed on the interlayer insulating layer 170 in the pad area PA. The pad connection electrode 185 may be connected to the pad 162 through the contact hole.

A passivation layer 191 is formed on the third conductive layer 180. The passivation layer 191 is formed widely on the display panel 50, and is formed to cover the source electrode 181, the drain electrode 182, the upper electrode 183 of the storage capacitor Cst, and the bridge electrode 184. A contact hole may be formed in the passivation layer 191 so that one region of the pad connection electrode 185 is exposed to the outside in the pad region PA.

An overcoat layer 192 may be formed on the passivation layer 191. The overcoat layer 192 is formed to cover the entire area of the passivation layer 191 in the display area AA.

After the overcoat layer 192 is formed, a via hole that allows the third conductive layer 180 to contact the upper layer may be formed. For example, a first via hole VIA1 that allows the drain electrode 182 to contact the anode electrode 210 to be formed later may be formed. In addition, a second via hole that allows the bridge electrode 184 to contact the auxiliary electrode 260 to be formed later may be formed. A region of the bridge electrode 184 may be exposed to the outside by the second via hole VIA2.

Figure 9:
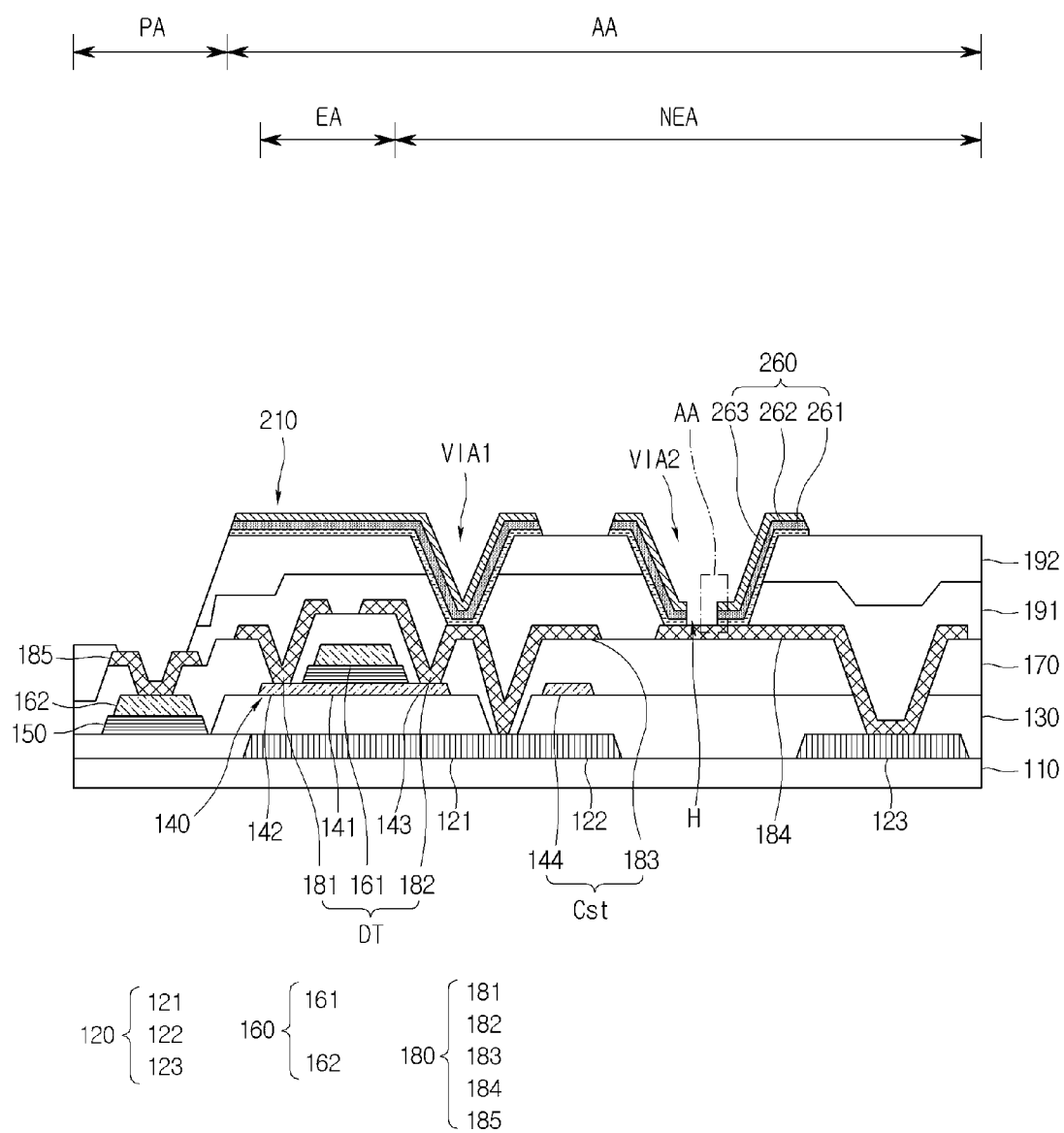

Referring to FIG. 9, an anode electrode 210 is formed on the overcoat layer 192. The anode electrode 210 is connected to the drain electrode 182 through the first via hole VIA1 passing through the overcoat layer 192 and the passivation layer 191.

An auxiliary electrode 260 is further formed on the overcoat layer 192. The auxiliary electrode 260 is connected to the bridge electrode 184 through the second via hole VIA2 passing through the overcoat layer 192 and the passivation layer 191.

Figure 10:
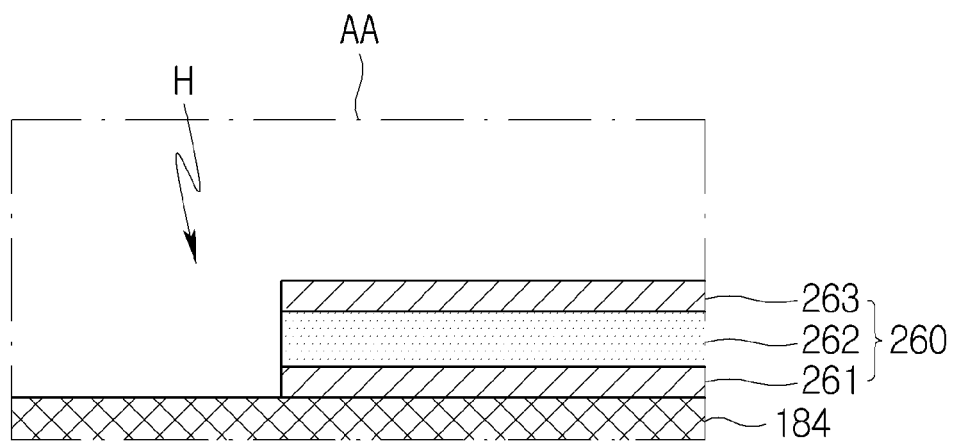

Referring to FIG. 10, the anode electrode 210 and the auxiliary electrode 260 may be formed of a triple layer composed of a transparent conductive layer 261, a reflective layer 262, and a transparent conductive layer 263. The transparent conductive layers 261 and 263 may be made of, for example, ITO, and the reflective layer 262 may be made of, for example, a metal material, such as silver or silver alloy. In this aspect, after the transparent conductive layer 261, the reflective layer 262, the transparent conductive layer 263 are stacked in sequence, the anode electrode 210 and the auxiliary electrode 260 may be formed by applying a selective etching solution to collectively etch the triple layer (wet etching) in a state of applying a mask corresponding to a pattern of the anode electrode 210 and the auxiliary electrode 260.

An electrode hole H may be formed in the auxiliary electrode 260. According to an aspect, an opening corresponding to the electrode hole H may be formed in the mask used for patterning the auxiliary electrode 260. Accordingly, the electrode hole H may be formed by a single wet etching process when the auxiliary electrode 260 is patterned. However, the method of forming the auxiliary electrode 260 is not limited thereto. According to another aspect, after the auxiliary electrode 260 is patterned, the electrode hole H may be formed through a separate etching process. As illustrated in FIG. 10, the transparent conductive layer 261, the reflective layer 262, and the transparent conductive layer 263 constituting the auxiliary electrode 260 may be exposed in the sidewall of the electrode hole H.

Figure 11:
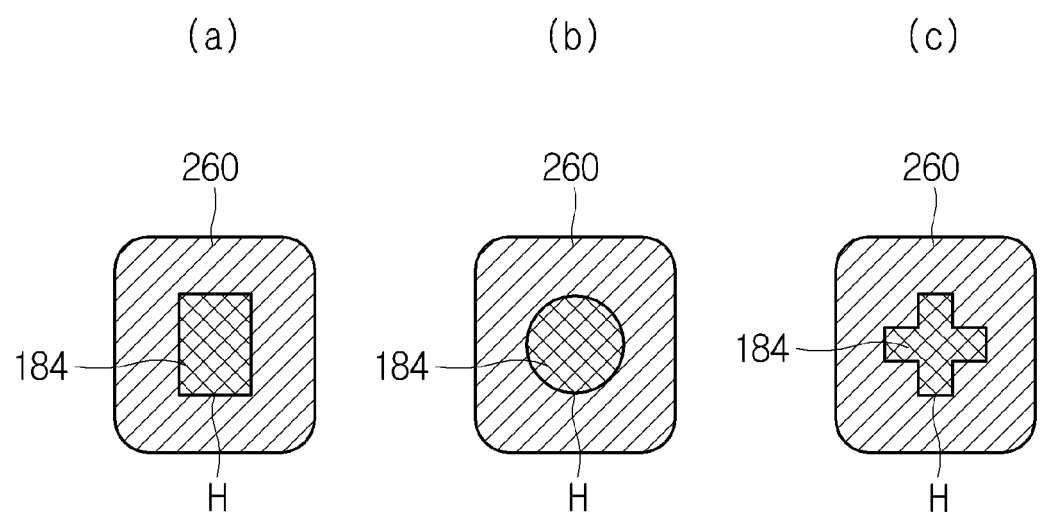

According to an aspect, the electrode hole H may be substantially formed in a rectangular shape or a rectangular shape as shown in (a) of FIG. 11, but is not limited thereto. The electrode hole H is formed in a circular or elliptical shape, as shown in (b) of FIG. 11, or the electrode hole H may be formed of a patterned polygon having a plurality of vertices, as shown in (c) of FIG. 11.

Figure 12:
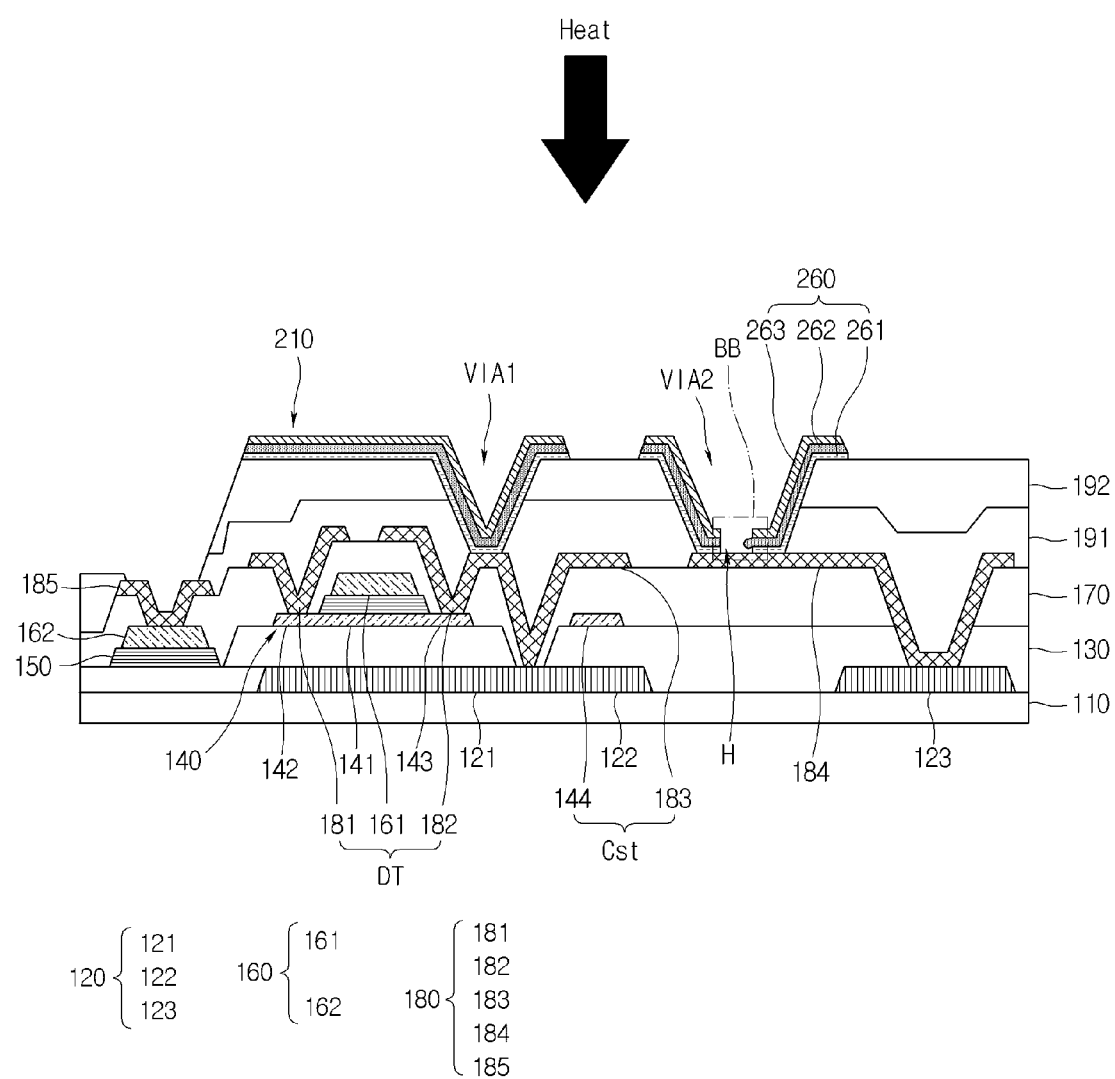
Figure 13:
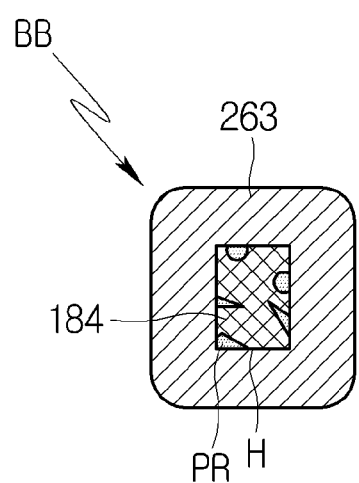
Figure 14:
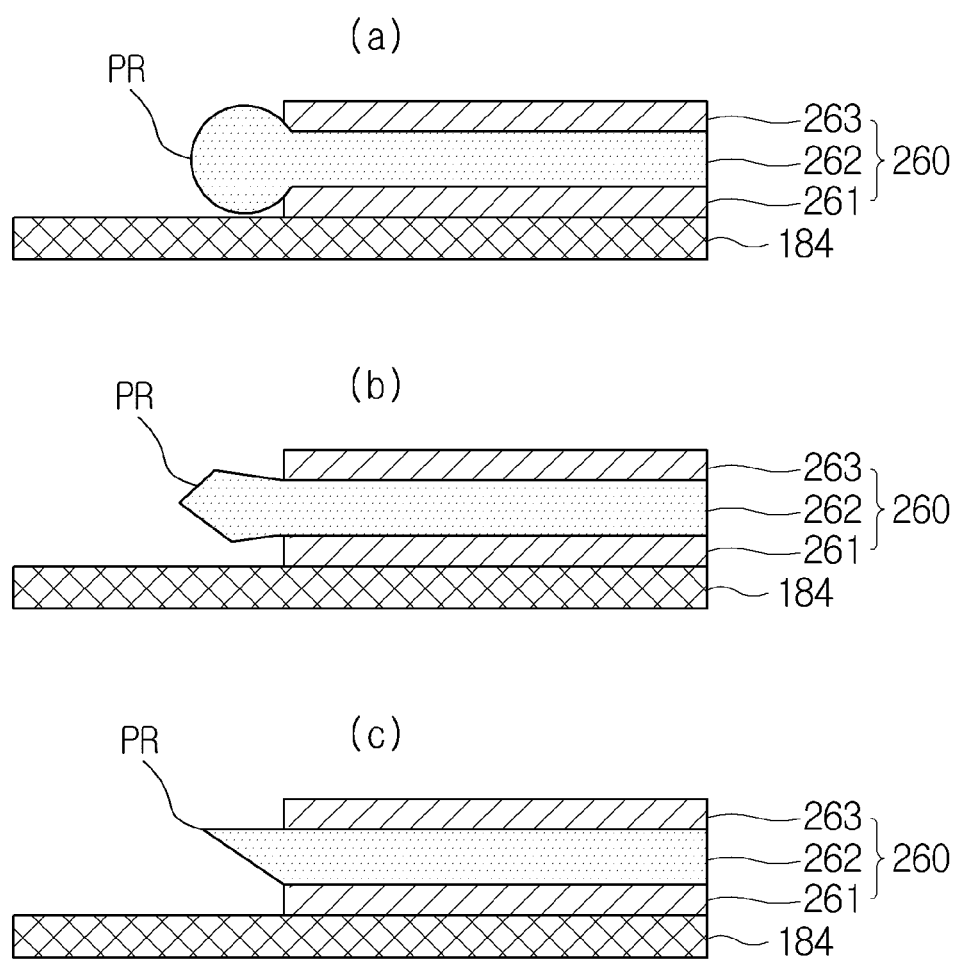

After the electrode hole H is formed, heat treatment is performed on the substrate 110 as shown in FIG. 12. Ion transition may occur at an exposed end of the metal layer, that is, the reflective layer 262, exposed to the outside by the heat treatment. By the ion transition, at least one protrusion PR is formed at the end of the reflective layer 262 as shown in FIGS. 13 and 14. The projection PR has a shape extending toward the inside from the side wall of the electrode hole H. The protrusion PR is formed in various irregular shapes as shown in (a) to (c) of FIG. 14. The end of the protrusion PR may have a curved surface or an angular shape, and may be formed in a reverse-tapered shape in at least one region.

Meanwhile, FIG. 12 shows an example in which heat treatment is performed on the substrate 110 to allow the protrusions PR to be grown, but the present aspect is not limited thereto. According to another aspects, the protrusion PR may be grown by leaving the substrate 110 at room temperature or treating the substrate 110 with ozone ($O_3$) or hydrogen sulfide ($H_2S$).

Alternatively, when patterning the electrode hole H, as the sidewalls of the electrode hole H are exposed to the etching solution, the ion transition may occur in the reflective layer 262, whereby the protrusion PR may be formed. In this aspect, a separate heat treatment or a hydrogen sulfide treatment process may not be required to form the projections PR.

Figure 15:
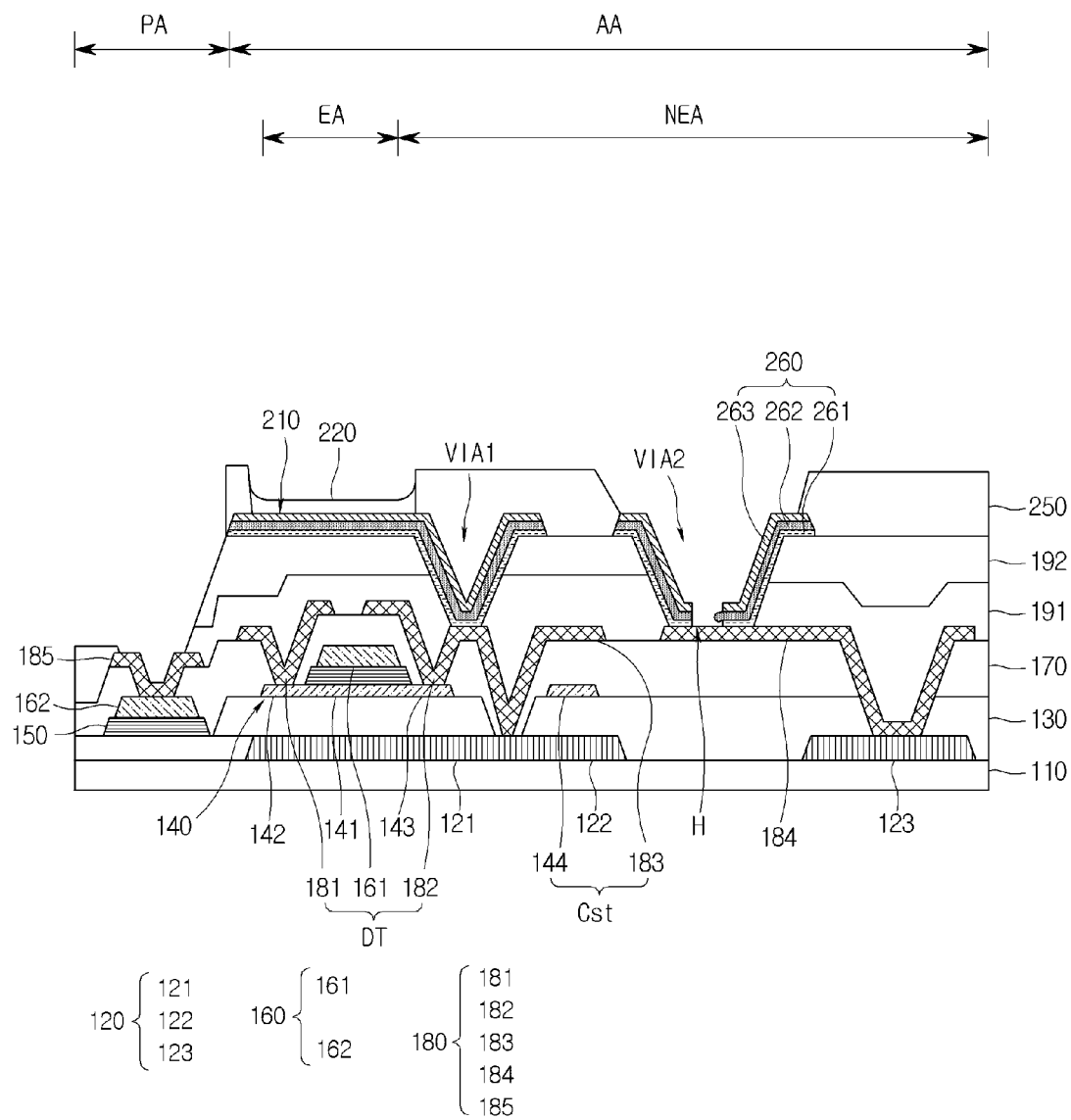

Referring to FIG. 15, the bank 250 is formed on the overcoat layer 192. The bank 250 may be formed in such a manner as to expose a partial region, for example, a center region, of the anode electrode 210, and cover the remaining region, for example, an edge. The bank 250 may be further formed in such a manner as to expose the center region of the auxiliary electrode 260 and cover the edge. Herein, the bank 250 may be formed so as not to cover the electrode hole H formed in the auxiliary electrode 260.

The bank 250 may be provided so that at least a portion of the surface is formed of hydrophobic. For example, the bank 250 may be formed through a photolithography process after applying a solution in which a hydrophobic material such as fluorine (F) is mixed with an organic insulating material. A hydrophobic material such as fluorine may move to the top portion of the bank 250 by light emitted during the photolithography process, and accordingly, the top surface of the bank 250 may have hydrophobic properties and the remaining region may have hydrophilic properties. However, the technical spirit of the present aspect is not limited thereto, and the entire portion of the bank 250 may have hydrophobic properties. The hydrophobic bank 250 may serve as a dam that prevents ink from mixing between the emission areas EAs, when a light emitting layer 220 is subsequently formed through a solution process.

Thereafter, the emission layer 220 may be formed. The emission layer 220 may be formed on the exposed anode electrode 210 in an emission area EA surrounded by the bank 250. The emission layer 220 may be formed through a solution process in which an organic solution is dropped into a cavity surrounded by the bank 250 using a nozzle or the like and then cured. The organic solution may be prevented from overflowing to the outside of the emission area EA by the hydrophobic bank 250.

When the light emitting layer 220 is formed via the solution process, a difference in height (thickness) of the light emitting layer 200 may occur between a center region of the light emitting layer 220 and an edge region adjacent to the bank 250 due to tension between the organic solution and the bank 250. For example, the top surface of the light emitting layer 220 may be formed in a concave shape having the lowest height in the center and the highest height in the region in contact with the bank 250. However, this aspect is not limited to this. That is, in various other aspects, structures (e.g., a hydrophilic bank, etc.) for improving thickness uniformity of the light emitting layer 220 may be disposed, and the light emitting layer 220 may have a substantially uniform height within the emission area EA.

Figure 16:
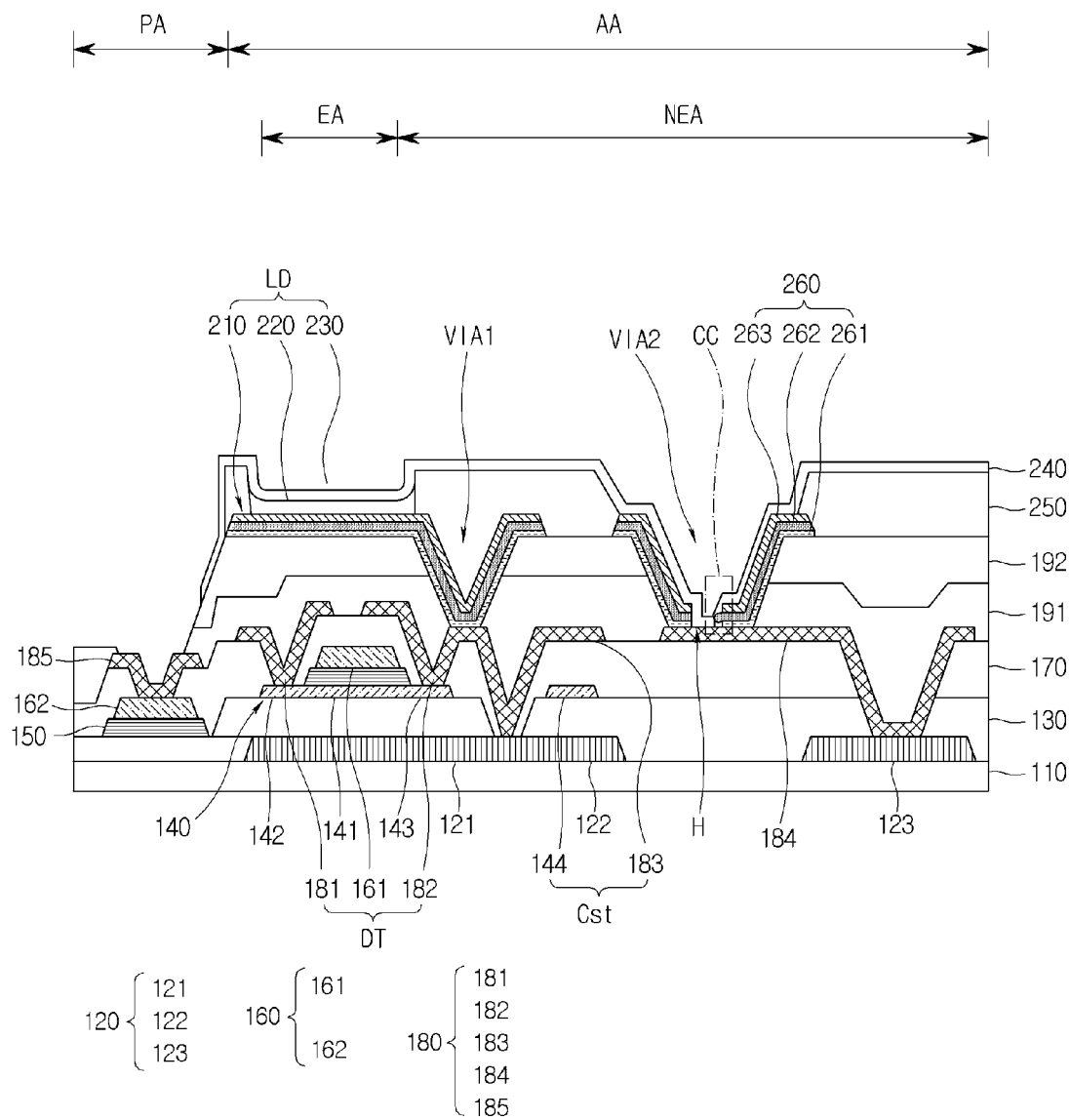

Referring to FIG. 16, an electron transport layer 240 is formed. The electron transport layer 240 is formed widely on the display area AA to cover the emission layer 220, the bank 250, and the auxiliary electrode 260.

Figure 17:
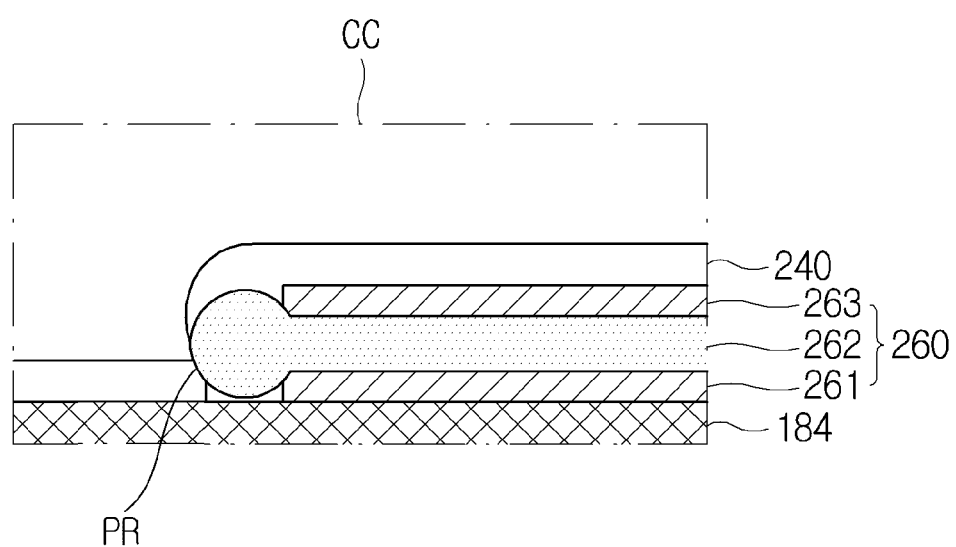

The electron transport layer 240 may be formed by evaporation deposition method such as thermal evaporation or physical vapor deposition method such as sputtering. Herein, the organic material constituting the electron transport layer 240 may be cut off around the projection PR according to a step coverage characteristic and thus may be discontinuously deposited. As shown in FIG. 17, as the electron transport layer 240 is cut off, a side surface and/or bottom surface of the protrusion PR may be not covered by the electron transport layer 240, but exposed to the outside.

Figure 18:
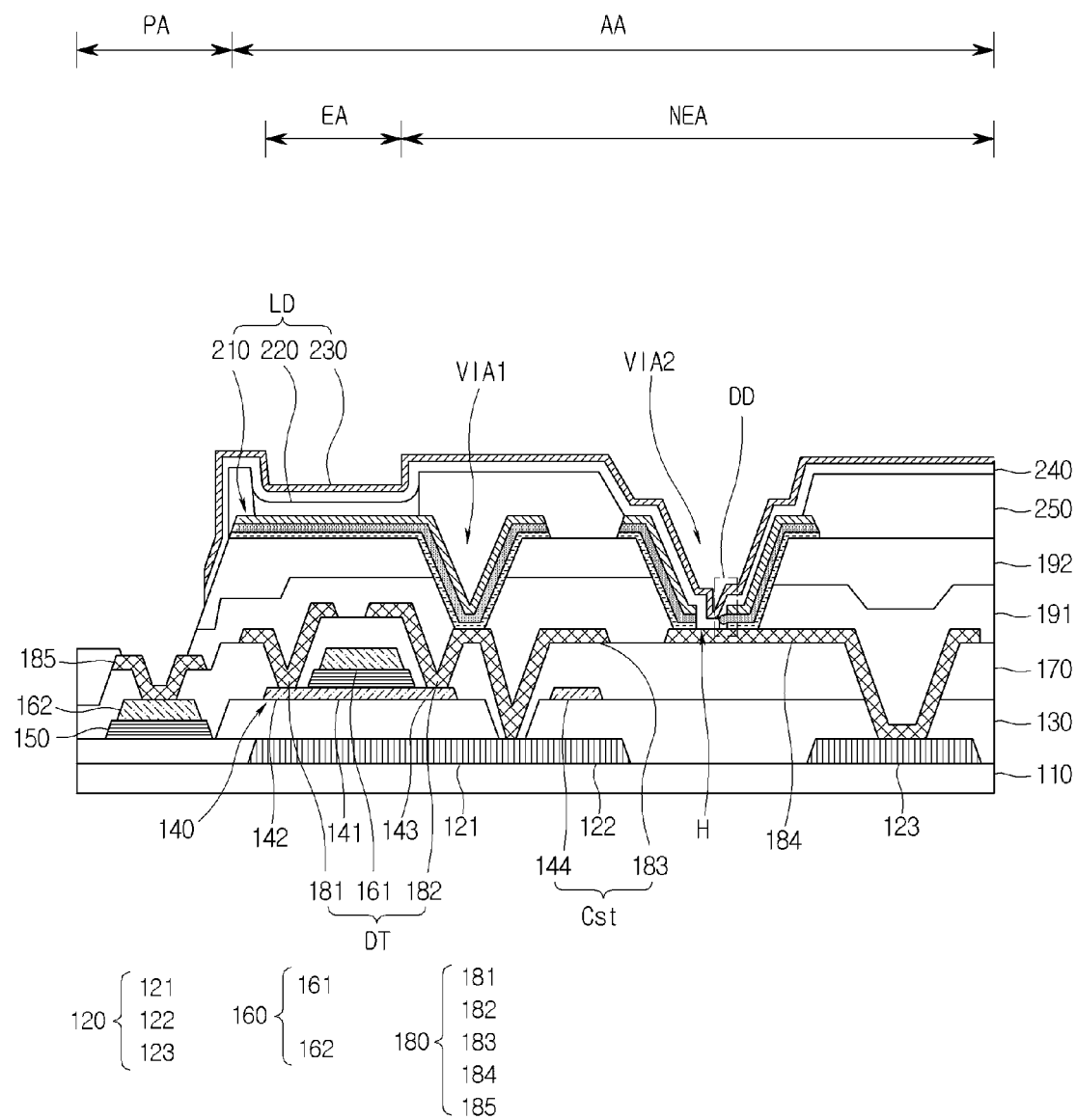
Figure 19:
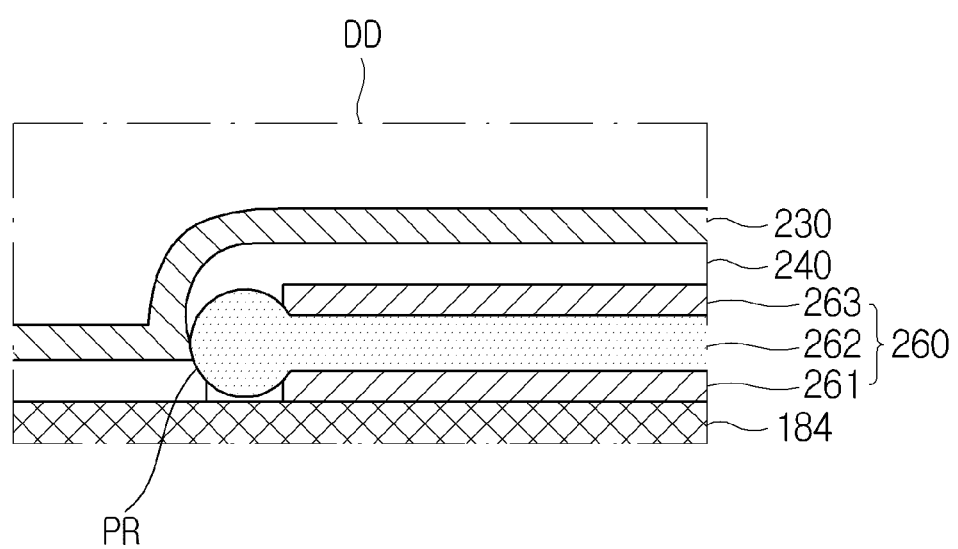

Referring to FIG. 18, a cathode electrode 230 is formed on the electron transport layer 240. The cathode electrode 230 may be formed widely in the display area AA. The cathode electrode 230 may be formed by evaporation deposition such as thermal evaporation or physical vapor deposition such as sputtering. Since the cathode electrode 230 has a better step coverage characteristic than the electron transport layer 240, the cathode electrode 230 is continuously formed without being cut around the protrusion PR, as shown in FIG. 19. The cathode electrode 230 may be formed to cover the side surface and/or bottom surface of the projection PR, where is not covered by the electron transport layer 240 but exposed to the outside.

As described above, as the cathode electrode 230 is directly contacted with the reflective layer 262, an electrical connection between the cathode electrode 230 and the auxiliary electrode 260 may be stably formed. The cathode electrode 230 may be stably connected to the second power line PL2 via the auxiliary electrode 260.

Figure 20:
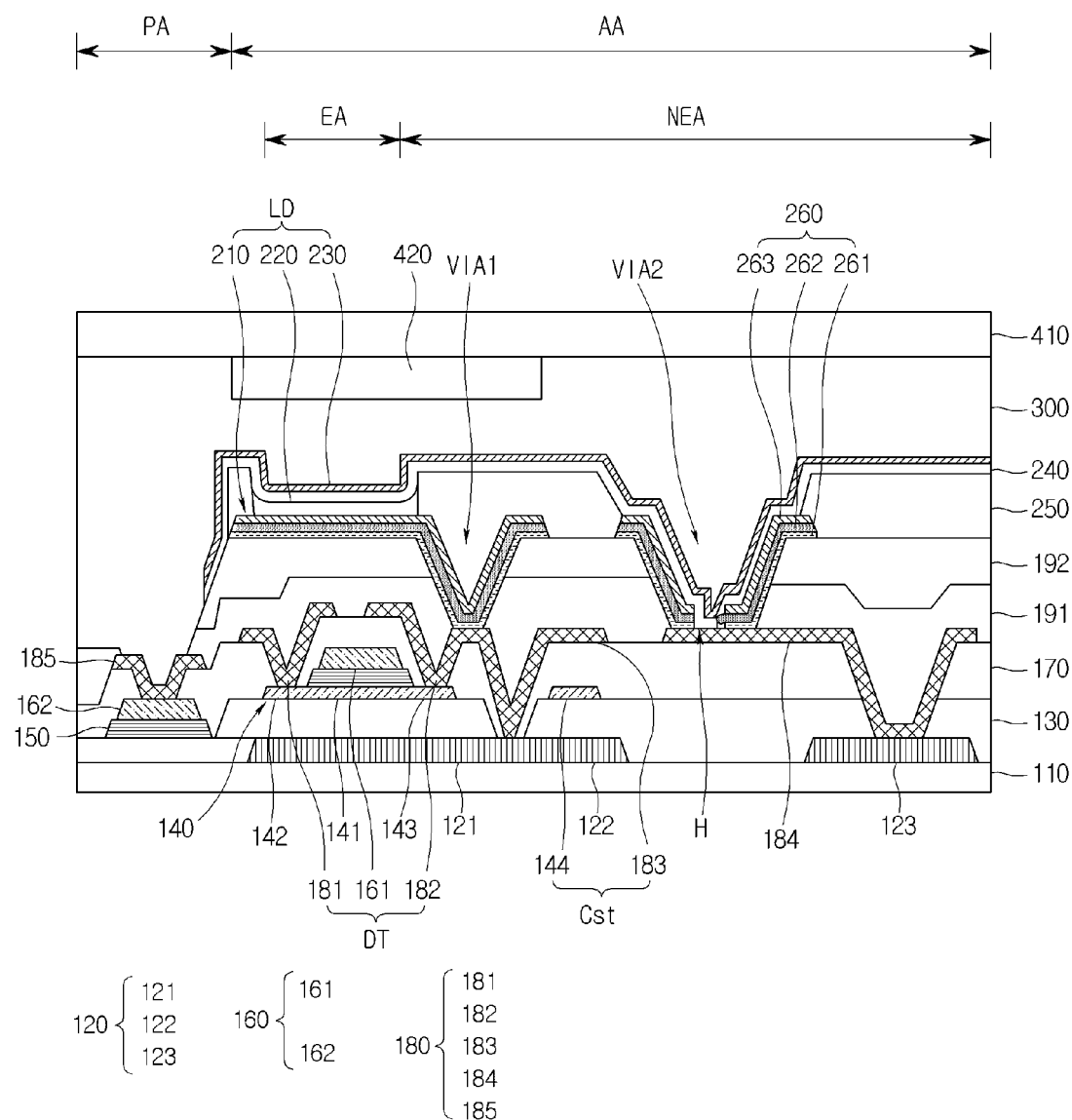

Referring to FIG. 20, an encapsulation layer 300 may be formed on the cathode electrode 230. In addition, a color filter 420 may be formed on the encapsulation layer 300. Subsequently, the cover substrate 410 may be formed at the uppermost top for the entire region of the substrate 110. In various aspects, after the color filter 420 is formed on the cover substrate 410, the substrate 110 and the cover substrate 410 may be coupled to each other through an adhesive or the like. However, the bonding method of the cover substrate 410 is not limited to this.

Those of ordinary skill in the art to which the present disclosure pertains will appreciate that the present disclosure may be implemented in other specific forms without changing its technical spirit or essential features. Therefore, it should be understood that the aspects described above are illustrative in all respects and not restrictive. It should be interpreted that the scope of the present disclosure is indicated by the scope of the claims, which will be described later, rather than the detailed description, and all the modified or modified forms derived from the meaning and scope of the claims and their equivalent concepts are included in the scope of the present disclosure.

What is claimed is:

1. A display device, comprising:
   a substrate where an emission area and a non-emission area are defined;
   a circuit element layer disposed on the substrate and having circuit elements;
   an overcoat layer covering the circuit element layer;
   an auxiliary electrode disposed on the overcoat layer in the non-emission area and having multiple layers, wherein the multiple layers includes a reflective layer interposed between transparent conductive layers;
   an electron transport layer covering the auxiliary electrode; and
   a cathode electrode disposed on the electron transport layer,
   wherein the auxiliary electrode includes an electrode hole passing through the multiple layers,
   wherein the reflective layer includes a plurality of protrusions each protruding toward inside from a sidewall of the electrode hole and contacting the cathode electrode, wherein the plurality of protrusions is formed on the reflective layer interposed between the transparent conductive layers of the auxiliary electrode, wherein at least two of the plurality of protrusions have different shapes, and wherein positions where the plurality of protrusions are formed inside the electrode hole are irregular.

2. The display device of claim 1, wherein the at least one protrusion of the plurality of protrusions has an irregular shape.

3. The display device of claim 1, wherein at least one protrusion of the plurality of protrusions has a shape in which at least one region is reverse-tapered.

4. The display device of claim 1, wherein the electron transport layer is discontinuously formed on at least one protrusion of the plurality of protrusions, and the cathode electrode is continuously formed on the at least one protrusion.

5. The display device of claim 1, wherein the electron transport layer covers one region of at least one protrusion of the plurality of protrusions and exposes another region.

6. The display device of claim 5, wherein the cathode electrode covers the exposed the another region of the at least one protrusion of the plurality of protrusions.

7. The display device of claim 1, wherein the auxiliary electrode includes silver or silver alloy.

8. The display device of claim 1, wherein the auxiliary electrode includes:

a first transparent conductive layer; and a second transparent conductive layer disposed on the first transparent conductive layer, wherein the reflective layer disposed on the first transparent conductive layer.

9. The display device of claim 1, wherein the circuit element layer includes:

an auxiliary wire disposed on the substrate and connected to a power line;

at least one insulating layer covering the auxiliary wire; and a bridge electrode disposed on the at least one insulating layer and connected to the auxiliary wire through a contact hole, wherein the auxiliary wire is connected to the bridge electrode through a via hole passing through the overcoat layer.

10. The display device of claim 9, wherein the electrode hole is disposed in a region corresponding to the via hole.

11. The display device of claim 1, further comprising:

an anode electrode disposed on the overcoat layer in the emission area;

a bank disposed on the overcoat layer and covering an edge region of the anode electrode and the auxiliary electrode; and a light emitting layer disposed in a center region of the anode electrode not covered by the bank, wherein the electron transport layer and the cathode electrode are widely formed on the emission area and the non-emission area.

12. The display device of claim 11, further comprising at least one of a hole injection layer and a hole transport layer interposed between the anode electrode and the emission layer.

13. The display device of claim 1, wherein the plurality of protrusions are formed by leaving the reflective layer at room temperature or treating the reflective layer with heat, ozone, or hydrogen sulfide.

* * * * *